United States Patent
Lyden et al.

(10) Patent No.: US 9,391,628 B1
(45) Date of Patent: Jul. 12, 2016

(54) LOW NOISE PRECISION INPUT STAGE FOR ANALOG-TO-DIGITAL CONVERTERS

(71) Applicant: ANALOG DEVICES GLOBAL, Hamilton (BM)

(72) Inventors: Colin G. Lyden, Baltimore (IE); Pasquale Delizia, Newbury (GB); Sanjay Rajasekhar, Newbury (GB); Yogesh Jayarman Sharma, Santa Clara, CA (US); Arthur J. Kalb, Santa Clara, CA (US); Marvin L. Shu, Palo Alto, CA (US); Gerard Mora-Puchalt, Catarroja (ES); Roberto S. Maurino, Turin (IT)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/967,880

(22) Filed: Dec. 14, 2015

Related U.S. Application Data

(60) Provisional application No. 62/246,488, filed on Oct. 26, 2015.

(51) Int. Cl.
| | |
|---|---|
| *H03M 1/38* | (2006.01) |
| *H03M 1/00* | (2006.01) |
| *H03M 1/06* | (2006.01) |
| *H03M 1/12* | (2006.01) |

(52) U.S. Cl.
CPC ............ *H03M 1/002* (2013.01); *H03M 1/0604* (2013.01); *H03M 1/0626* (2013.01); *H03M 1/1245* (2013.01); *H03M 1/38* (2013.01)

(58) Field of Classification Search
CPC . H03M 1/0863; H03M 1/0682; H03M 1/167; H03M 1/804; H03M 1/34; H03M 3/35; H03M 3/326; H04L 25/08; H04L 27/04; H03G 3/008

USPC ............. 341/130–165; 375/312, 240, 345; 330/254, 258, 260
See application file for complete search history.

(56) References Cited

U.S. PATENT DOCUMENTS

| | | | | |
|---|---|---|---|---|
| 6,052,412 A | * | 4/2000 | Ruether | .............. H04L 25/4927 375/231 |
| 6,674,379 B1 | * | 1/2004 | Li | .......................... G05B 21/02 341/123 |

(Continued)

OTHER PUBLICATIONS

Martin Mienkina et al., *Understanding the 16-bit ADC PGA in Kinetis K Series*, Freescale Semiconductor Application Note, Document No. AN4568, Rev. 0, Sep. 2012, 10 pages.

*Primary Examiner* — Lam T Mai
(74) *Attorney, Agent, or Firm* — Patent Capital Group

(57) ABSTRACT

An input stage to an analog to digital converter (ADC) includes at least one sampling capacitor (SC) for sampling an input signal in acquire phases, a capacitive gain amplifier (CGA) for providing the input signal to the SC, and bandwidth control means. The bandwidth control means is configured to ensure that the SC has a first bandwidth during a first part of an acquire phase and has a second bandwidth during a subsequent, second, part of said acquire phase, the second bandwidth being smaller than the first. In this manner, first, the input signal is sampled at a higher, first, bandwidth allowing to take advantage of using a high-bandwidth CGA to minimize settling error on the SC, and, next, during a second part of the same acquire phase, the input signal is sampled at a lower, second, bandwidth advantageously decreasing noise resulting from the use of a high-bandwidth CGA.

27 Claims, 14 Drawing Sheets

(56) References Cited

U.S. PATENT DOCUMENTS

| | | | |
|---|---|---|---|
| 7,088,273 B1 * | 8/2006 | Perdoor | H03M 1/0863 341/120 |
| 7,265,705 B1 * | 9/2007 | Lee | H03M 1/145 341/160 |
| 7,289,504 B1 * | 10/2007 | Hippelainen | H04L 29/12216 370/338 |
| 7,626,526 B2 * | 12/2009 | Philips | H03M 3/382 341/143 |
| 7,795,960 B2 | 9/2010 | Lyden et al. | |
| 7,936,297 B2 | 5/2011 | Hurrell et al. | |
| 8,604,962 B1 * | 12/2013 | Lewyn | H03M 1/0863 341/161 |
| 8,971,754 B2 | 3/2015 | Abe et al. | |
| 2009/0115522 A1 * | 5/2009 | Lyden | H03F 3/387 330/258 |
| 2010/0176979 A1 * | 7/2010 | Hurrell | H03M 1/0626 341/155 |
| 2011/0215957 A1 * | 9/2011 | Hummerston | H03M 1/12 341/155 |

* cited by examiner

LOW NOISE PRECISION INPUT STAGE FOR ANALOG-TO-DIGITAL CONVERTERS

CROSS-REFERENCE TO RELATED APPLICATIONS

This application claims the benefit of and priority from U.S. Provisional Patent Application Ser. No. 62/246,488 filed 26 Oct. 2015 entitled "LOW NOISE PRECISION INPUT STAGE FOR ANALOG-TO-DIGITAL CONVERTERS," which is incorporated herein by reference in its entirety.

TECHNICAL FIELD OF THE DISCLOSURE

The present invention relates to the field of integrated circuits, in particular to low noise precision input stages for analog-to-digital converters.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense. As the applications needing ADCs grow, the need for accurate and reliable conversion performance also grows.

OVERVIEW

Embodiments of the present disclosure provide systems and methods for enabling an input stage for ADCs featuring low noise, low power, and high precision.

One aspect of the present disclosure provides a system that may be considered to be an input stage for an ADC, the input stage system including at least one sampling capacitor configured to sample an input signal in acquire phases, a capacitive gain amplifier (CGA), which may be either programmable or fixed gain amplifier, configured to provide said input signal to the sampling capacitor, and bandwidth control means configured to control that the sampling capacitor has a first bandwidth during a first part of an acquire phase and that the sampling capacitor has a second bandwidth during a second part of said acquire phase, the said part following the first part of the same acquire phase, the second bandwidth being smaller than the first bandwidth.

Another aspect of the present disclosure provides a method of operating an ADC input stage that includes at least one sampling capacitor configured to sample an input signal in acquire phases and a CGA configured to provide said input signal to the sampling capacitor. The method includes ensuring that the sampling capacitor has a first bandwidth during a first part of an acquire phase and ensuring that the sampling capacitor has a second bandwidth during a second part of said acquire phase, said second part following said first part of the same acquire phase and said second bandwidth being smaller than said first bandwidth.

Embodiments of the present disclosure are based on an insight of gaining up the input signal with a capacitive amplifier and then filtering it before sampling for converting a particular analog input value is finished. A 'dynamic' filtering is used to allow accurate settling during the first, high bandwidth, phase. The following low bandwidth mode then reduces the sampled noise power. The capacitive amplifier can be easily modified to accept a DAC input and as such, can implement the critical input summing junction found on many ADC architectures, such as e.g. pipeline, sigma delta, etc.

As will be appreciated by one skilled in the art, aspects of the present disclosure may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing CGAs, ADCs or/and their controllers, etc.) or be stored upon manufacturing of these devices and systems.

Other features and advantages of the disclosure are apparent from the following description, and from the claims.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of Analog-to-Digital Converters (ADCs)

Figure 1:
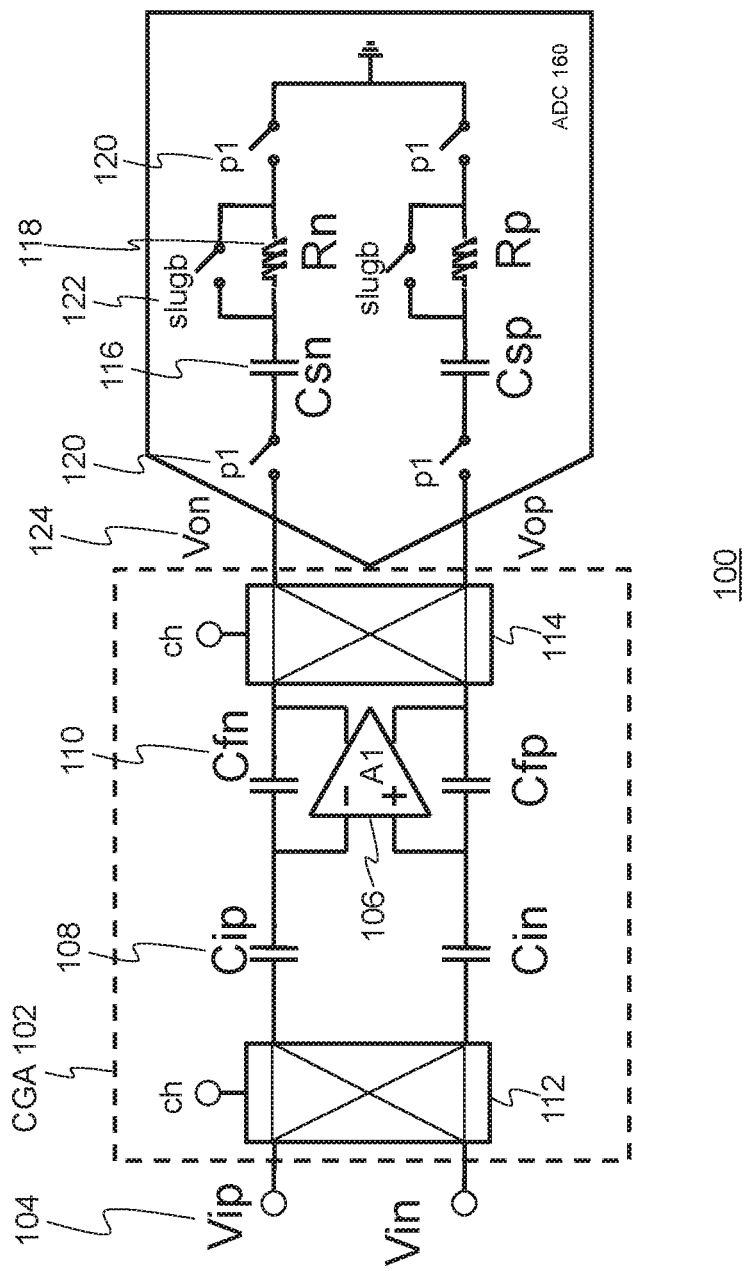
FIG. 1 illustrates an input stage for an ADC, according to some embodiments of the present disclosure.

Analog to digital converters (ADCs) are electronic devices that convert a continuous physical quantity carried by an analog signal to a digital number that represents the quantity's amplitude (or to a digital signal carrying that digital number). The conversion involves quantization of the analog input signal, so conversion typically introduces a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal.

There are many types of ADC technologies such as flash, sigma-delta, successive approximation routine converters, etc. These different styles of converters may be used in combination. In some converter topologies, an input signal is sampled onto a capacitor or an array of capacitors commonly referred to as "sampling capacitors" prior to the analog to digital conversion taking place. During the sampling operation, charge is exchanged between the sampling capacitor(s) and a circuit driving the sampling capacitor(s) so that the sampling capacitor(s) are charged to a voltage corresponding to the value of the input signal at that time. The driving circuit typically has an impedance such that it takes time to charge and discharge the sampling capacitor to its correct voltage. Terms such as "acquisition/acquire phase" or "sampling phase" may be used to describe a phase, i.e. a time period, when sampling capacitor(s) connected to an input node at which the input signal is received are being charged to a voltage corresponding to the input voltage. In other words, "acquire phase" or "sampling phase" refer to a time period when sampling capacitor(s) are sampling an analog input signal in order to convert the analog input signal to a digital output signal. Terms "sampling" and "acquire phase" may be used interchangeably to refer to the action of one or more sampling capacitors connected to an input node sampling or acquiring an input signal during a certain time period. An acquire phase is followed, which may but does not have to be in immediate succession (i.e. may or may not be done consecutively), by a phase that is typically referred to as a "conversion phase," where an analog value of the input signal sampled on the sampling capacitor(s) is converted to a digital value by comparison of the charge accumulated on the sampling capacitor(s) with one or more reference voltage values. After acquisition and conversion phases for converting one analog input value are finished, processing described above is repeated for the next analog input value.

An ADC is usually defined by the following application requirements: its bandwidth (the range of frequencies of analog signals that can be properly converted to a digital signal), its resolution (the number of discrete levels that the maximum analog signal can be divided into and represented in the digital signal), its signal to noise ratio (how accurately the ADC can measure signal relative to the noise the ADC introduces), and its dynamic range (the minimum resolvable step size and the ratio between the largest and smallest possible inputs). ADCs have many different designs, which can be chosen based on the application requirements.

Programmable Gain Amplifiers in ADCs

Programmable Gain Amplifier (PGA) is an electronic amplifier, whose gain is controlled by external digital or analog circuits.

Capacitive PGAs are electronic amplifiers that include multiple input capacitors coupled to a common mode input of an amplifier and multiple feedback capacitors coupled to an output of the amplifier.

Low noise, low power and high accuracy CPGAs can be implemented using a chopped differential amplifier with capacitors as feedback elements, where the term "chopped" is used to describe the swapping (i.e. the exchange) of the polarity of the inputs and outputs of the CPGA at a rate given by the chopping clock. Swapping the polarity of the inputs (outputs) of the CPGA is equivalent to multiplying the input signal (output signal) of the CPGA by a +1, −1, +1, −1, . . . sequence and it is typically done to amplify DC and low frequency signals with the CPGA. This type of CPGA is described in U.S. Pat. No. 7,795,960, the disclosure of which is incorporated herein in its entirety.

CPGAs are inherently low noise since the only noise source in a CPGA is the amplifier. Capacitors are essentially noise-free. Capacitors do not transfer DC signals and, therefore, an input chop circuit converts an input DC signal into a square wave. The square wave is gained up by the amplifier with capacitive feedback. An output chop circuit then demodulates the amplified square wave back to a gained up DC signal. Low noise can be achieved because capacitors are noiseless and hence the differential amplifier is the only noise source in the PGA. Gain is accurately defined by the ratio of capacitors, which is stable and can be well controlled in integrated circuit ("IC") manufacturing processes. Programmable gain can be achieved by changing the values of the capacitors, e.g., by switching capacitors in or out of the amplifier circuit from a bank of capacitors.

A PGA may be used in an ADC in order to increase dynamic range of the ADC.

For a high accuracy ADC system, a high bandwidth CPGA is desirable to minimize the settling error of the sampling capacitors of an ADC, the settling error generally referring to the residual error caused by the finite duration of the acquisition phase. Typically a CPGA will require some time to charge an ADC sampling capacitor to a given accuracy. The higher the bandwidth of the CPGA, the smaller the settling error and hence the higher the accuracy, for a given duration of the acquisition phase. However, although a CPGA on its own is low noise, driving an ADC directly with a CPGA does not necessarily result in the lowest noise. In fact, employing high bandwidth CPGA has the undesirable consequence of a substantial increase in noise sampled by the ADC. One reason for it is that there is always wide bandwidth noise at the input of the CPGA, either generated by the amplifier of the CPGA or by the circuitry preceding the CPGA. Thermal noise is an example of unavoidable wide bandwidth noise. Besides gaining up desired signals provided to a sampling stage of an ADC, such noise is also increased by the gain of the CPGA and is sampled on the sampling capacitors of the sampling stage, resulting in large noise being sampled. The sampling action of an ADC causes noise aliases to fold into the Nyquist band. The number of noise aliases folding is proportional to the ratio between the bandwidth of the CPGA and the sampling frequency of the ADC.

Similar considerations are applicable to capacitive gain amplifiers which are not programmable, i.e. fixed gain. Therefore, while embodiments of the present disclosure are particularly suitable for CPGAs, they are equally applicable to fixed gain CGAs.

Proposed Low Noise Precision Input Stage for an ADC

The undesirable consequence of using a CGA to drive an ADC, described above, may be mitigated by sampling the input signal in a single acquire phase at two different bandwidths. First, the input signal is sampled at a higher, first, bandwidth allowing to take advantage of using a high bandwidth CGA to minimize the settling error on the sampling capacitor. Next, during a second portion of the same acquire phase, the input signal is sampled at a lower, second, bandwidth advantageously filtering out, or at least decreasing, noise resulting from the use of a high bandwidth CGA.

Therefore, one aspect of the present disclosure provides an ADC that includes at least one sampling capacitor configured to sample an input signal in acquire phases, a capacitive programmable gain amplifier (CGA) configured to provide said input signal to the sampling capacitor, and bandwidth control means configured to control that the sampling capacitor has a first bandwidth during a first part of an acquire phase and that the sampling capacitor has a second bandwidth during a second part of said acquire phase, the said part following the first part of the same acquire phase, the second bandwidth being smaller than the first bandwidth.

As used herein, the term "bandwidth of a sampling capacitor" is used to describe the bandwidth of the transfer function from the input of the CGA to the terminals of the sampling capacitor. This is different from a "bandwidth of an ADC" which refers to a range of frequencies of analog signals that the ADC can properly convert to a digital signal. Limiting a bandwidth of a sampling capacitor from the first bandwidth to the second bandwidth that is smaller than the first bandwidth effectively changes the noise bandwidth of a CGA that provides an input signal to the sampling capacitor. In other words, limiting a bandwidth of a sampling capacitor from the first bandwidth to the second bandwidth effectively changes the bandwidth of the input signal provided by the CGA to be sampled by the sampling capacitor during a particular acquire phase (i.e. bandwidth is changed during a single acquisition).

FIG. 1 illustrates an input stage 100 for an ADC, according to some embodiments of the present disclosure. As shown in FIG. 1, the input stage includes a capacitive programmable gain amplifier (CGA) 102 followed by a dynamic filter that is configured to dynamically change bandwidth of the sampling capacitors, as described herein.

Figure 2:
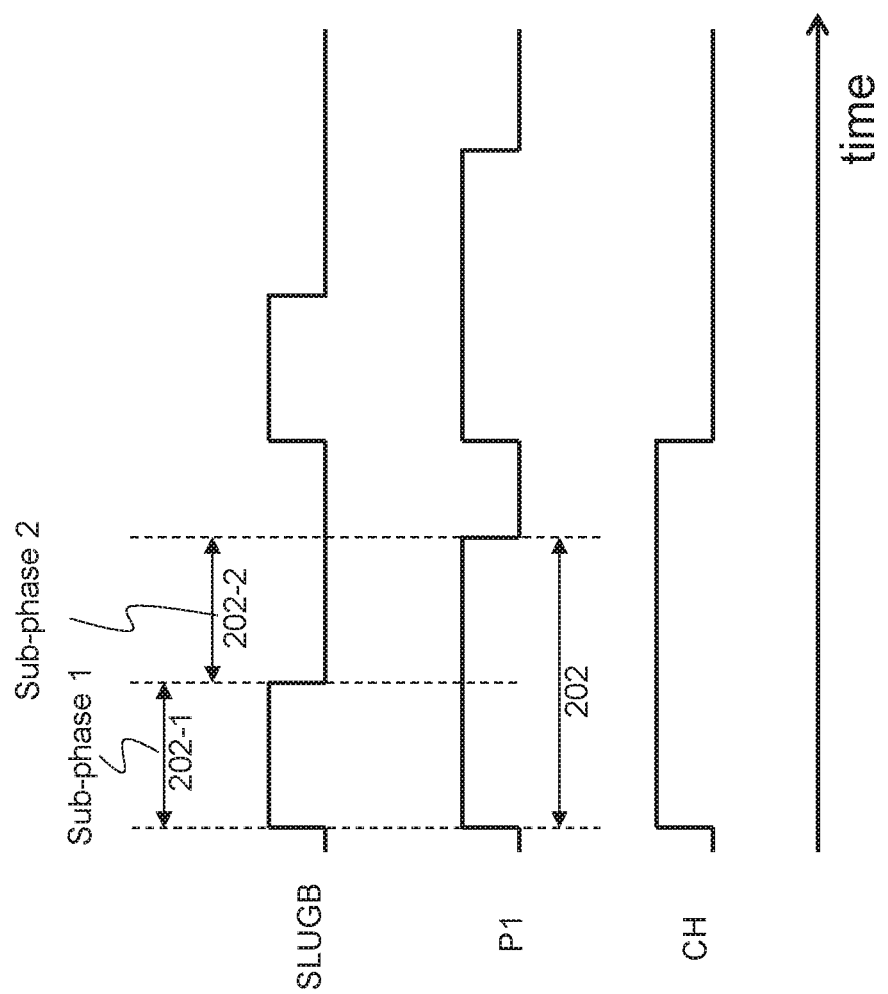
FIG. 2 illustrates a timing diagram for an input stage of an ADC implementing a CGA, according to some embodiments of the present disclosure.
Figure 5:
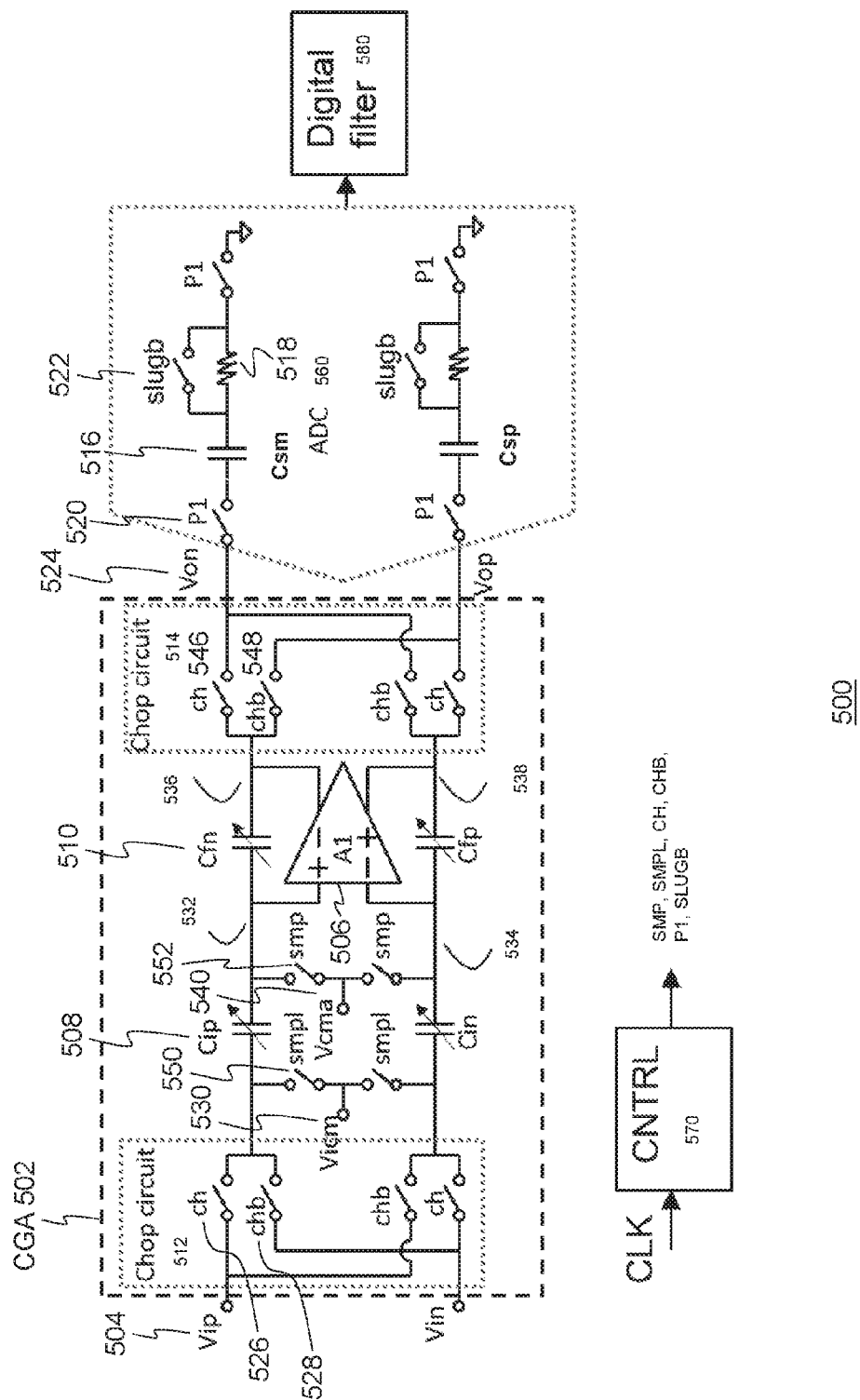
FIG. 5 illustrates an input stage for an ADC with common mode sampling, according to some embodiments of the present disclosure.

The CGA 102 may receive differential input at the input nodes Vip, Vin 104 (in order to not clutter the drawings provided in the FIGUREs, reference numerals to pairs of differential components are shown only on one side—e.g. reference numeral 104 points only to Vip, but not to Vin, even though it refers to both). The CGA 102 may include a differential amplifier A1 106, a pair of variable input capacitors Cin, Cip 108, a pair of variable feedback capacitors Cfn, Cfp 110 and two chop switch circuits ch1 112 and ch2 114. A first chop circuit 112 may be provided at an input to the CGA 102 and a second chop circuit 114 may be provided at an output of the CGA 114. A more detailed description of functionality of the chop circuits 112 and 114 is provided below with reference to FIG. 5 illustrating analogous chop circuits 512, 514. As described below with reference to FIG. 5, the chop circuits 112 and 114 include switches which are controlled by control signal CH and CHB, of which control signal CH is shown in FIG. 2.

Capacitors Csn and Csp 116 represent the input sampling caps of the ADC and could include, or be a part of, an array of sampling capacitors (not specifically shown in FIG. 1).

To provide high accuracy and low noise at the same time, the input state of FIG. 1 utilizes a dynamic filter, which, in an exemplary embodiment shown in FIG. 1, may be implemented by providing a lowpass RC filter of a resistor in series with each sampling capacitor, as shown in FIG. 1 with one of the resistors Rn, Rp 118 being in series with a corresponding sampling capacitor Csn, Csp 116 (i.e. Rn in series with Cs, Rp in series with Csp).

FIG. 1 further illustrates switching means p1 120 and slugb 122 configured to operate as described below in order to change bandwidth of the sampling capacitor during an acquire phase. Together, resistors Rn, Rp 118, and switches p1 120 and slugb 122 may be viewed as an example of bandwidth control means configured to ensure that the sampling capacitors Csn, Csp 116 have a first bandwidth during a first part of an acquire phase for converting a particular input value, and a second bandwidth during a second part of the same acquire phase. A person of ordinary skill in the art will readily recognize that, in other embodiments, bandwidth control means configured to ensure decrease in the bandwidth of sampling capacitor(s) during a single acquire phase may be implemented differently, all of which implementations are, therefore, being within the scope of the present disclosure.

The input stage 100 may further include a controller (not shown in FIG. 1) that generates control signals CH, P1 and SLUGB to the CGA 102, e.g. in response to an external timing signal, such as a clock signal CLK.

FIG. 2 illustrates a timing diagram for an input stage of an ADC implementing a CGA, e.g. the input stage 100 shown in FIG. 1, according to some embodiments of the present disclosure. FIG. 2 illustrates control signals SLUGB, P1, and CH for, respectively, switches slugb 122, switches p1 120, and switches ch of the chop circuirts 112 and 114.

As shown in the timing diagram of FIG. 2, the sampling/acquire phase 202 (control signal P1 is high) on the ADC input capacitors is divided in two sub-phases.

In a first sub-phase of the acquire phase 202, indicated in FIG. 2 as sub-phase 202-1, control signal P1 is high (i.e. switch p1 is closed) and control signal SLUGB is high (i.e. switch slugb is closed). During this initial sub-phase, resistors Rn and Rp shown in FIG. 1 are shorted out and input sampling capacitors Csp and Csp are charged accurately to the output voltages of the CGA Vop and Von 124. During this sub-phase, the bandwidth of the CGA loaded by the ADC sampling capacitors Csp and Csn is high, corresponding to a wide acquisition bandwidth BW1 302-1, schematically illustrated with a transfer function shown in FIG. 3. This means that signal and noise components up to frequency bandwidth BW1 are gained up by the CGA gain and applied across the terminals of sampling capacitors Csp and Csn.

Figure 3:
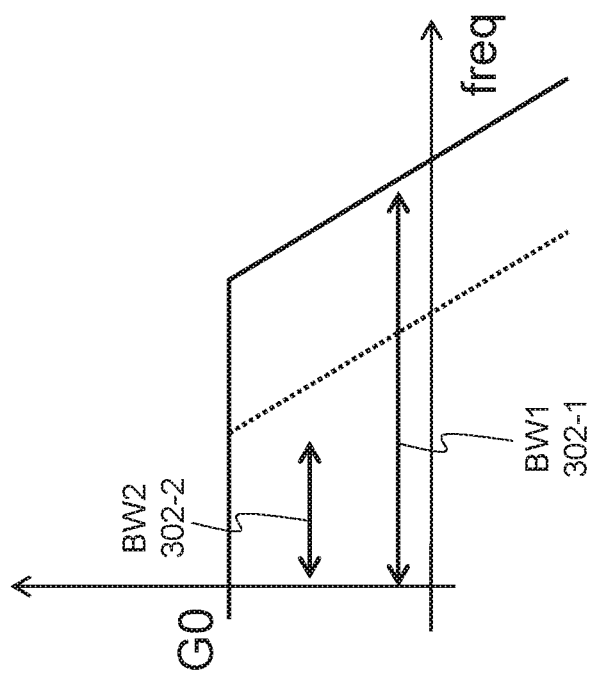
FIG. 3 illustrates first and second acquisition bandwidths, according to some embodiments of the present disclosure.

In FIG. 3, G0 is the DC gain from the CGA inputs to the sampling capacitor terminals.

In a second sub-phase of the acquire phase 202, indicated in FIG. 2 as sub-phase 202-2, control signal P1 is high (i.e. switch p1 is closed) and control signal SLUGB is low (i.e. switch slugb is open). During this second sub-phase, resistors Rn and Rp, in series with sampling capacitors Csp and Csn, implement a low pass RC filter that decreases the bandwidth of the sampling capacitors. Only signal components, including noise components, up to frequency BW2 302-2, also schematically illustrated in FIG. 3, are now amplified and applied to sampling capacitors Csp and Csn. This reduces the amount of noise sampled on Csp and Csn. As a result, the voltage on capacitors Csp and Csn can be a low noise and accurate representation of the input signal gained up by the CGA.

In the timing diagram of FIG. 3, control signal "CH" defines the state of the chop circuits 112 and 114. When control signal CH is high, the chop circuits let the signal go straight through, when control signal CH is low, the chop circuits swap the polarity of the signal.

Many ADC architectures, including pipeline and sigma delta, require the implementation of a functional block that produces the difference between the input and a DAC signal. The input stage of FIG. 1 can be conveniently modified to implement such a function by simply adding a second pair of capacitors as shown in FIG. 4.

Notice that the DAC itself can be conveniently implemented as a capacitive DAC by splitting Cdacp and Cdacn in a number of sub-capacitors.

Figure 4:
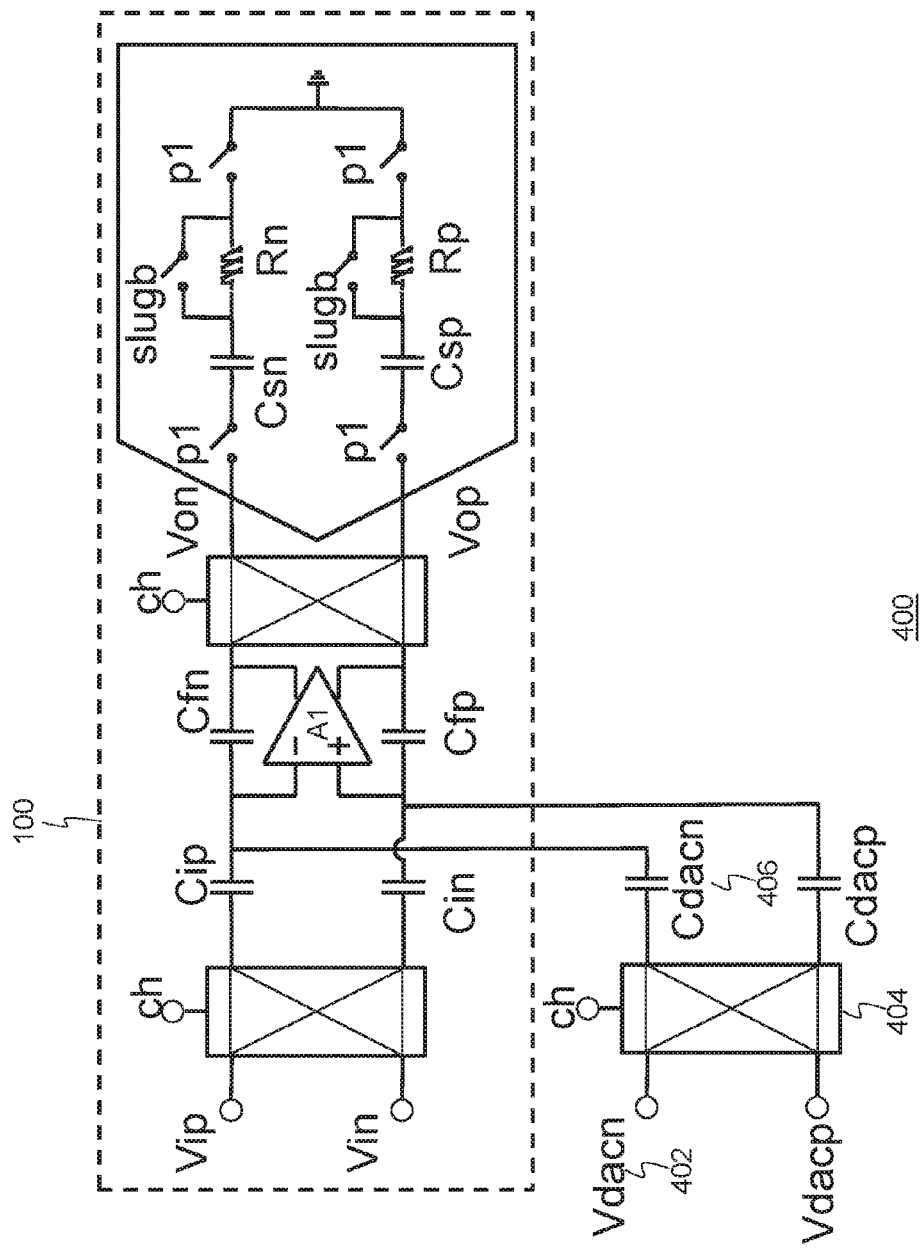
FIG. 4 illustrates an input stage for an ADC with a summing junction, according to some embodiments of the present disclosure.

A modified input stage 400 shown in FIG. 4 includes all of the elements of the input stage 100, enclosed in a dashed box indicated with a reference numeral 100, as well as differential DAC input Vdacp, Vdacn 402, an additional chop circuit 404, and a pair of additional capacitors Cdacp, Cdacn 406. As shown in FIG. 4, one terminal of each one of the capacitors Cdacp, Cdacn 406 is connected to the chop circuit 404 while the other terminal is connected to one input of the differential amplifier 106.

Defining the DAC capacitance Cdac as Cdac=Cdacp=Cdacn, input capacitance Ci as Ci=Cip=Cin and feedback capacitance Cf as Cf=Cfp=Cfn, if the gain of amplifier A1 is very large (ideally infinite), it can be shown that:

$$Vop-Von=Ci/Cf(Vip-Vin)-Cdac/Cf(Vdacp-Vdacn)$$

The operation of the modified input stage 400 is analogous to the operation of input stage 100 with the only difference that the CGA output (Vop−Von) is now given by the difference between the input voltage (Vip−Vin), gained by a factor Ci/Cf, and the DAC voltage (Vdacp−Vdacn), gained up by a factor Cdac/Cf.

A number of different ways exist to implement a dynamic filter that can be used to dynamically change bandwidth of the sampling capacitors from BW1 to BW2 during a single acquisition phase. Some of them are described in U.S. Pat. No. 7,936,297 B2, Hurrell and al., "Analog to Digital Converter," the disclosure of which is incorporated herein in its entirety.

In addition, CGAs do not naturally define the common mode of a voltage presented at the inputs of the differential amplifier, which should be matched to the common mode of the amplifier itself. One approach to setting this voltage involves including additional circuitry, which typically involves very large resistors. This approach is not always appropriate because it is intrinsically slow and introduces additional noise. Another approach to defining the common mode voltage at the input of the amplifier is described in U.S. Pat. No. 8,791,754 C. Lyden et al., "Programmable gain amplifier with common mode sampling," the disclosure of which is incorporated herein in its entirety as well. This approach could be used in an input stage with bandwidth control means during an acquire phase as described herein, such as e.g. the input stage 100 shown in FIG. 1.

A more detailed schematic of the implementation of FIG. 1 showing the circuitry that defines the common mode of the CGA is shown in FIG. 5 as an input stage 500. The input stage 500 includes a CGA 502, which is a variation of the CGA 102 shown in FIG. 1, therefore, unless stated otherwise, descriptions provided with respect to elements of FIG. 1 are applicable to elements of FIG. 5 and, in the interests of brevity, are not repeated. Further, like reference numerals referring to like elements in FIGUREs presented herein indicate like elements, description of which is not repeated—e.g. input nodes Vip, Vin 504 shown in FIG. 5 are analogous to the input nodes Vip, Vin 104 shown in FIG. 1 and described above, differential amplifier 506 shown in FIG. 5 is analogous to the differential amplifier 106 shown in FIG. 1 and described above, etc. FIG. 5 also illustrates chopper circuits 512, 514 at, respectively, the input and the output of the CGA 502 at the switch level. Chopper circuits 512, 514 could be used as the chopper circuits 112, 114 in the input stage shown in FIG. 1. Still further, unless stated otherwise, descriptions provided below with reference to FIG. 5 are also applicable to like elements of FIG. 1.

As shown in FIG. 5, the CGA may include a differential amplifier A1 506, a pair of variable input capacitors Cip, Cin 508, a pair of variable feedback capacitors Cfn, Cfp 510, and two chop switch circuits 512, 514. A first chop circuit 512 may be provided at an input to the PGA 502 and a second chop circuit 514 may be provided at an output of the PGA 502.

As shown in FIG. 5, the first chop circuit 512 may connect a pair of differential input terminals Vip, Vin 504 of the PGA 502, respectively, to first terminals of the input capacitors Cip, Cin 508 (called "input terminals," for convenience). Output terminals of the input capacitors Cip, Cin 508 ("output terminals") may be connected to, respectively, input terminals 532, 534 of the amplifier A1 506. The feedback capacitors Cfn, Cfp 510 each may be coupled in a feedback configuration between respective outputs 536, 538 of the amplifier A1 and respective inputs 532, 534 of the amplifier A1. The amplifier outputs 536, 538 may be coupled to inputs of the second chop circuit 514. Outputs of the second chop circuit 514 may be coupled to output terminals Von, Vop 524 of the PGA 502 and, further, to ADC 560.

The chop circuits 512, 514 may configure orientation of signal flow about the amplifier A1. The chop circuits 512, 514 each may include an array of switches that selectively connect the inputs of the respective circuits to its outputs. Specifically, the first chop circuit 512 may include two pairs of switches—switches ch 526 and chb 528—controlled, respectively, by control signals "CH" and "CHB" shown in FIG. 6. As shown in FIG. 5, one of the ch switches 526 may connect an input terminal of the Cip capacitor to the Vip terminal, and the other ch switch 526 may connect an input terminal of Cin to the Vin terminal. One of the chb switches 528 may connect the input terminal of the Cip capacitor to the Vin terminal and the other chb switch 528 may connect the input terminal of Cin to the Vip terminal. The CH and CHB control signals for the switches ch 526 and chb 528, respectively, may operate so that, when one is high, the other one is low, during chop phases of operation of the PGA 502 (described below). Control signals CH and CHB may both be low at the same time because they can be non-overlapping, e.g. during the DCMS phases of operation. Thus, CH and CHB may be viewed as complementary non overlapping clock.

Similarly, the second chop circuit 514 may include two pairs of switches, shown as switches 546, 548, controlled respectively by control signal CH or CHB which control signals are analogous or the same as the control signals CH and CHB for the switches 526, 528, respectively. As shown in FIG. 5, one of the ch switches 546 may connect an output terminal 536 of the amplifier A1 to the Von terminal 524 and the other ch switch 546 may connect an output terminal 538 of the amplifier A1 to the Vop terminal 524. One of the chb switches 548 may connect the output terminal 536 to the Vop terminal and the other chb switch 548 may connect the output terminal 538 to the Von terminal.

The capacitors Cip, Cin 508 as well as capacitors Cfn, Cfp 510 may be variable capacitors. That is, each capacitor Cip or Cin 508, and Cfn or Cfp 510 may include an array of switched capacitor devices (not shown). During operation, the input capacitors Cip, Cin 508 may be set to have equal capacitance to each other and feedback capacitors Cfn, Cfp 510 may be set to have equal capacitance to each other. A ratio of capacitances between the input capacitors Cip/Cin and the feedback capacitors Cfn/Cfp, however, may be controlled by control signals (not shown) to provide programmable gain of the PGA 502.

The PGA 502 differs from the PGA 102 of FIG. 1 in that the PGA 502 may include a pair of voltage sources Vicm 530 and Vcma 540 coupled to the input capacitors Cip, Cin 508 by respective sampling switches smpl 550 and smp 552. The voltage Vicm 530 may be set to a common mode voltage of differential signals input to the PGA 502 at the Vip, Vin terminals 504. The Vicm voltage source may be coupled to input terminals of the input capacitors Cip, Cin 508 via a pair of switches smpl 550 that close in response to a first control signal SMPL. The voltage Vcma may be set to an input common mode voltage of the amplifier A1. The Vcma voltage source may be coupled to the input terminals 532, 534 of the amplifier A1 (also output terminals of the input capacitors Cip, Cin 508) via second switches smp 552 that close in response to a second control signal SMP.

The input stage 500 may further include a controller 570 that generates control signals SMP, SMPL, CH, CHB, P1 and SLUGB to the PGA 502, e.g. in response to an external timing signal, such as a clock signal CLK.

Figure 6:
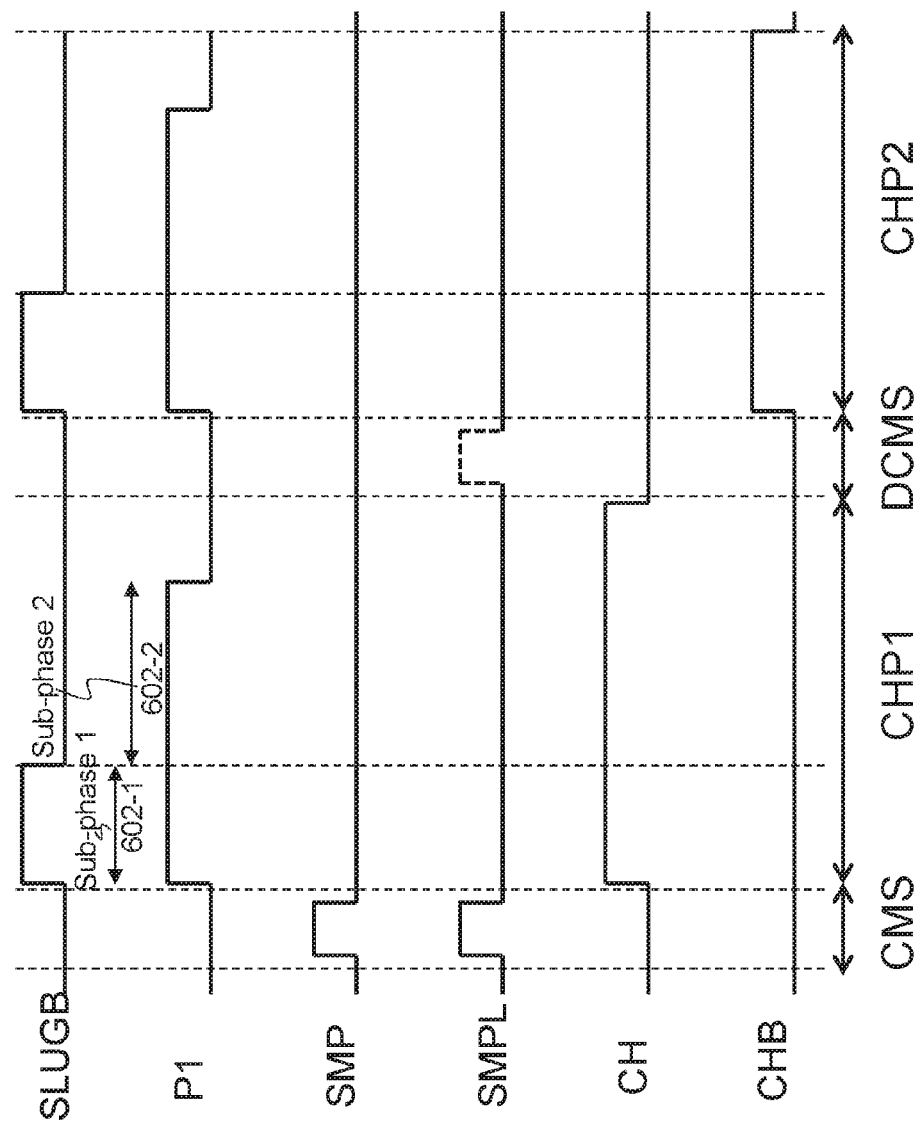
FIG. 6 illustrates a timing diagram for the input stage shown in FIG. 5, according to some embodiments of the present disclosure.

FIG. 6 is a timing diagram illustrating operation of the PGA 502 according to an embodiment of the present invention. As illustrated, operation of the PGA 502 may occur over several phases, denoted "CMS," "CHP1," "CHP2" and an optional phase, labeled "DCMS." During the CMS phase, a common mode sampling phase, the PGA 502 may capture the common mode voltages Vicm and Vcma. The smp switches 552 and smpl switches 550 may be closed (SMP and SMPL control signals being high), which may connect input terminals of the input capacitors Cip, Cin 508 to Vicm and output terminals of the capacitors Cip, Cin 508 to Vcma. The switches of the chop circuits 512, 514 may be held open during the CMS phase (control signals CH and CHB being low). Thus, each capacitor Cip, Cin 508 may store a voltage ($V_{Cip}$, $V_{Cin}$, respectively) representing a difference between the common mode voltages of the two domains: $V_{Cin}=V_{Cip}=$Vicm−Vcma. The sampling operation may define the amplifier input common mode for the amplifier A1 and retain the common mode voltage persistent at the amplifier's inputs 532, 534 during other phases of operation.

During the first chop phase (CHP1), the chop circuits 512, 514 may be activated (CH control signal is high) and the sample switches smp 552, smpl 550 may be opened (SMP and SMPL control signals being low). The common mode voltage sources Vicm, Vcma may be disconnected from the input capacitors Cip, Cin 508 by the sample switches smp 552, smpl 550. The CH control signal being high in this phase may cause its associated switches ch 526 in chop circuit 512 to be closed, thereby connecting the input signal at the Vip input to the input capacitor Cip and the input signal at the Vin input to the input capacitor Cin. The CH control signal also may cause its associated switches 546 in the chop circuit 514 to be closed, which may connect the feedback capacitor Cfn to the output terminal Von and feedback capacitor Cfp to the output terminal Vop. Configured in this manner, the PGA 502 may amplify a differential input signal presented as input voltages Vip, Vin 504 based on a ratio of the input capacitors Cip/Cin to the amplifier feedback capacitors Cfn/Cfp.

The differential signals input to the Vip, Vin 504 terminals may vary about the common mode voltage Vicm of the PGA's predecessor circuit (not shown). Application of the differential signals to the input capacitors Cip, Cin 508 may cause counterpart voltages to be applied to the inputs 532, 534 of the amplifier A1 but shifted to the common mode voltage Vcma of the amplifier A1 due to the voltages sampled on the input capacitors Cip, Cin 508 during the CMS phase.

During the second chop phase (CHP2), configuration of the chop circuits 512, 514 may be inverted. The sample switches smp 552, smpl 550 may remain open, keeping the common mode voltage sources Vicm, Vcma disconnected from the input capacitors Cip, Cin 508. The CHB control signal may cause its associated switches chb 528 in the chop circuit 512 to be closed, thereby connecting the signal at input Vip to the input capacitor Cin and the signal at input Vin to the input capacitor Cip. In this manner, the chop circuit 512 inverts distribution of the PGA input signals to the input terminals 532, 534 of the amplifier A1 as the PGA 502 transitions from the CHP1 phase to the CHP2 phase and inverts the distribution again as the PGA 502 transitions from the CHP2 phase to the CHP1 phase.

The CHB control signal may cause its associated switches chb 548 in the chop circuit 514 to be closed also, which may connect the amplifier output terminal 536 to output terminal Vop and the amplifier output terminal 538 to output terminal Von. As with the first chop circuit 512, the second chop circuit 514 may invert distribution of voltages from output terminals 536, 538 of the amplifier A1 to output terminals Von, Vop as the PGA 502 transitions from the CHP1 phase to the CHP2 phase and inverts them again as the PGA 502 transitions from the CHP2 phase to the CHP1 phase. Nevertheless, the PGA 502 amplifies a differential input signal presented as input voltages Vip, Vin 504 based on a ratio of the input capacitors Cip/Cin to the amplifier feedback capacitors Cfn/Cfp.

As in the CHP1 phase, during the CHP2 phase, the input voltages Vip, Vin 504 may vary about the common mode voltage Vicm of the PGA's predecessor circuit (not shown). Application of the Vip, Vin 504 input voltages to the input capacitors Cin, Cip 508 may cause counterpart voltages to be applied to inputs of the amplifier A1 but shifted to the common mode voltage Vcma of the amplifier A1 due to the voltages sampled on the input capacitors Cip, Cin 508 during the CMS phase. Thus, the PGA 502 may perform a sampling operation during the CMS phase that may define a common mode for input signals presented to the amplifier A1 during the operational phases CHP1, CHP2 that matches to the amplifier's common mode.

In some cases, the CHP2 phase may follow the CHP1 phase immediately. Optionally, however, a "dummy common mode sampling" phase (DCMS) may be introduced between successive chop phases. The DCMS phase may provide symmetry in amplifier output signals during operation. During the DCMS phase, the SMPL signal may cause the input-side plates of input capacitors Cip and Cin to be connected to Vicm. Closing the smpl switches 550 (SMPL control signal high —as shown in FIG. 6) may cause the amplifier output to go to zero (neglecting A1 offset), which may cause output voltages at the onset of the CHP2 phase to have the same initial conditions as at the onset of the CHP1 phase. As illustrated in FIG. 6, during the DCMS phase, the SMP signal may maintain its associated switches as open, those connected to Vcma. In such circumstances, no sampling action occurs in the DCMS phase and, therefore, no additional thermal noise on capacitors (kT/C noise) is introduced to the PGA. At the end of phase CHP2, a new CMS phase can follow and the timing diagram may be repeated.

In another embodiment, a single CMS sampling phase can be followed by multiple chop phases (CHP1, CHP2). Dummy common mode sampling phases DCMS may be introduced between consecutive chop phases CHP2, CHP1 for better symmetry in the output signal. However, the common mode response of the circuit 502 may be fastest if the common mode is resampled after the first CHP2 phase. Further, kT/C noise captured during CMS phase is up-converted at the chop frequency, which can be filtered out by the post-processing digital filter.

Now operation of the bandwidth control according to embodiments of the present disclosure is described for the input stage of FIG. 5. As shown in FIG. 6, at the beginning of sampling/acquire phase CHP1 (first part of the acquire phase), clock SLUGB is high (switch slugb 522 is closed), which shorts out the resistor 518 in series with the sampling caps Csp and Csm 516 of the ADC 560. This allows for a fast settling/acquisition of the output of the CGA Von, Vop 524 on the sampling caps 516 of the ADC. After the fast acquisition has occurred, SLUBG goes low, in a second part of the same acquire phase CHP1, adding the resistor 518 in series with each of the sampling caps Csp and Csm 516. The resistor 518 reduces the bandwidth of the ADC sampling network and hence greatly attenuate the noise from CGA 502 or any circuitry preceding the CGA 502. Hence, at the falling edge of P1 an accurate and low noise representation of the CGA output is sampled on the ADC input caps Csp and Csm. The sampled voltage is then processed by the ADC circuitry (not shown) and provide to the optional digital filter 580. The same happens in CHP2.

It should be noted that the ADC circuitry needs some finite time to process the sampled voltage. This processing occurs while P1 is low during the chop phases. This is the reason for P1 to go low before CH or CHB fall in FIG. 6, as well as in FIG. 2 described above.

The digital filter 580 may be configured to e.g. provide some averaging of the converted ADC samples. The averaging may be configured to remove the chopped kT/C noise that had been sampled on the CGA input caps Cip, Cin 508 to define the input common mode, as described above.

There are a number of different ways to generate the input common mode voltage Vicm in FIG. 5, and those are described in detail in U.S. Pat. No. 8,791,754.

Figure 7:
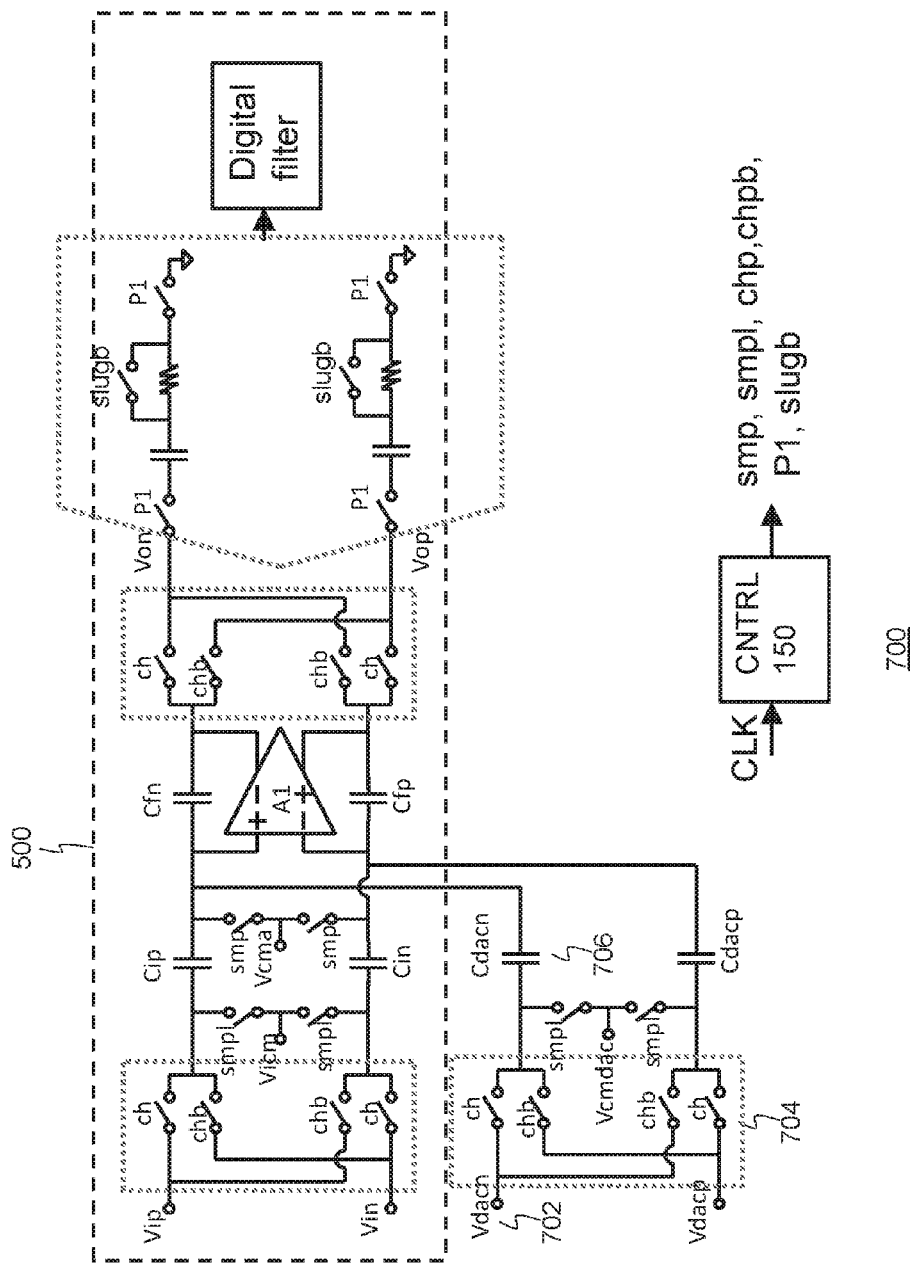
FIG. 7 illustrates low noise precision summing junction for an ADC with common mode sampling, according to some embodiments of the present disclosure.

The scheme described with reference to the input stage 500 can be readily applied to the summing junction circuit of FIG. 4, as shown in FIG. 7. Note that, with the input stage of FIG. 5, the DAC capacitors Cdacp and Cdacn 706 shown in FIG. 7 sample the DAC common mode voltage Vcmdac. If Vdacp and Vdacn span the range 0V to Vref, then Vcmdac is set to Vref/2. The common mode DAC voltage Vcmdac does not need to be generated explicitly. It can be generated by sampling half of Cdacp to Vref, and half of Cdacp to 0V (ground), and similarly on Cdacn, by sampling half of Cdacn to Vref and half of Cdacn to ground, during the CMS (or DCMS) phases.

Figure 8:
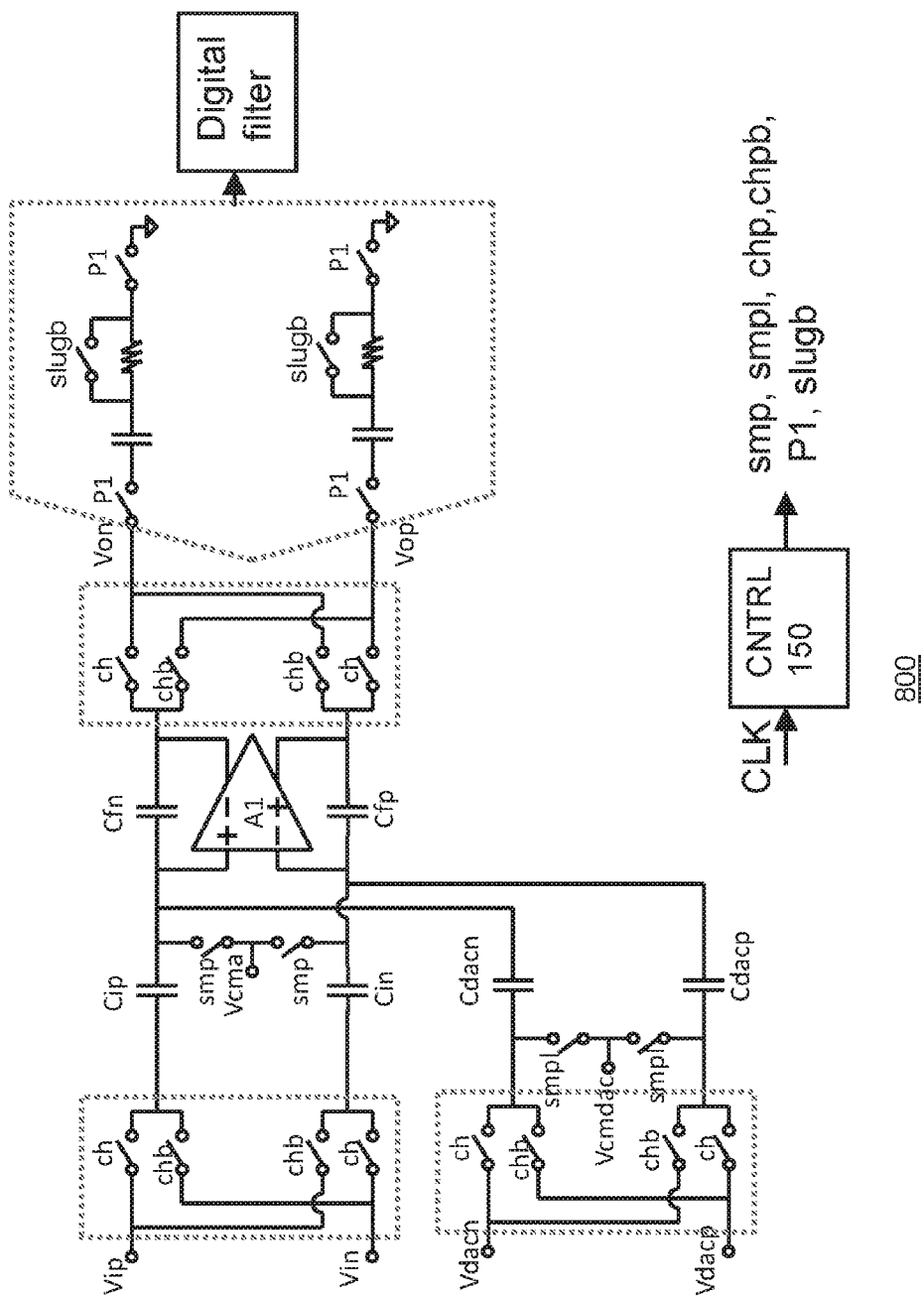
FIG. 8 illustrates low noise precision summing junction for an ADC with an alternative common mode sampling scheme, according to some embodiments of the present disclosure.

A variant of the common mode sampling scheme is shown in FIG. 8. Arrangement 800 of FIG. 8 differs from the arrangement 700 of FIG. 7 only in that the Vicm and associated switches smpl are absent, while the rest of the elements are the same, and therefore, descriptions provided above for FIGS. 7 and 5 are applicable here except where it concerns Vicm. As a result of Vicm being absent in the configuration shown in FIG. 8, the common mode is sampled only on Cdacp and Cdacn. In this scheme, the common mode voltage at the input of the amplifier A1 takes longer to settle to the desired value of Vcma, but it might be acceptable if the input common mode of Vip and Vin is moving slowly.

Figure 9:
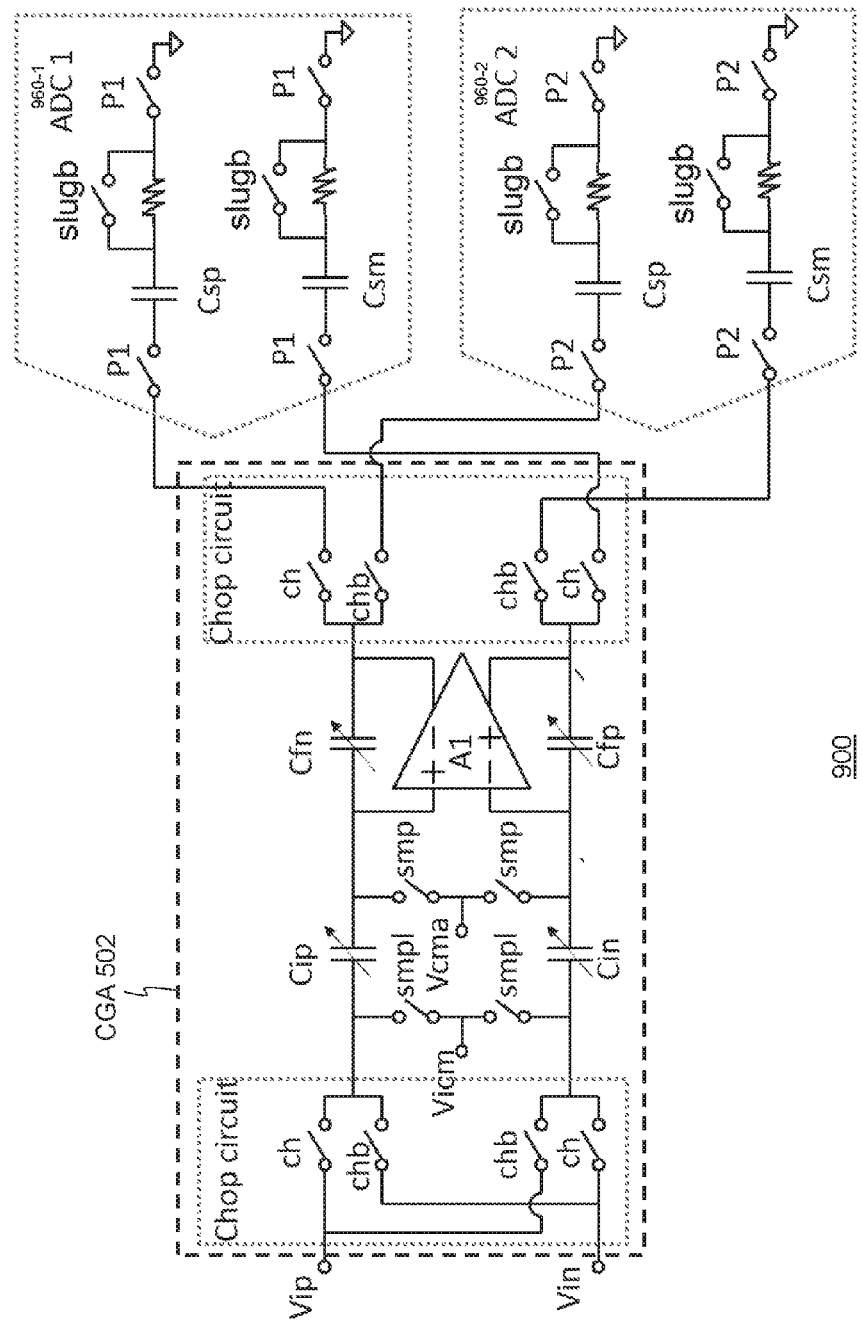
FIG. 9 illustrates an input stage with two backend ADCs, according to some embodiments of the present disclosure.
Figure 10:
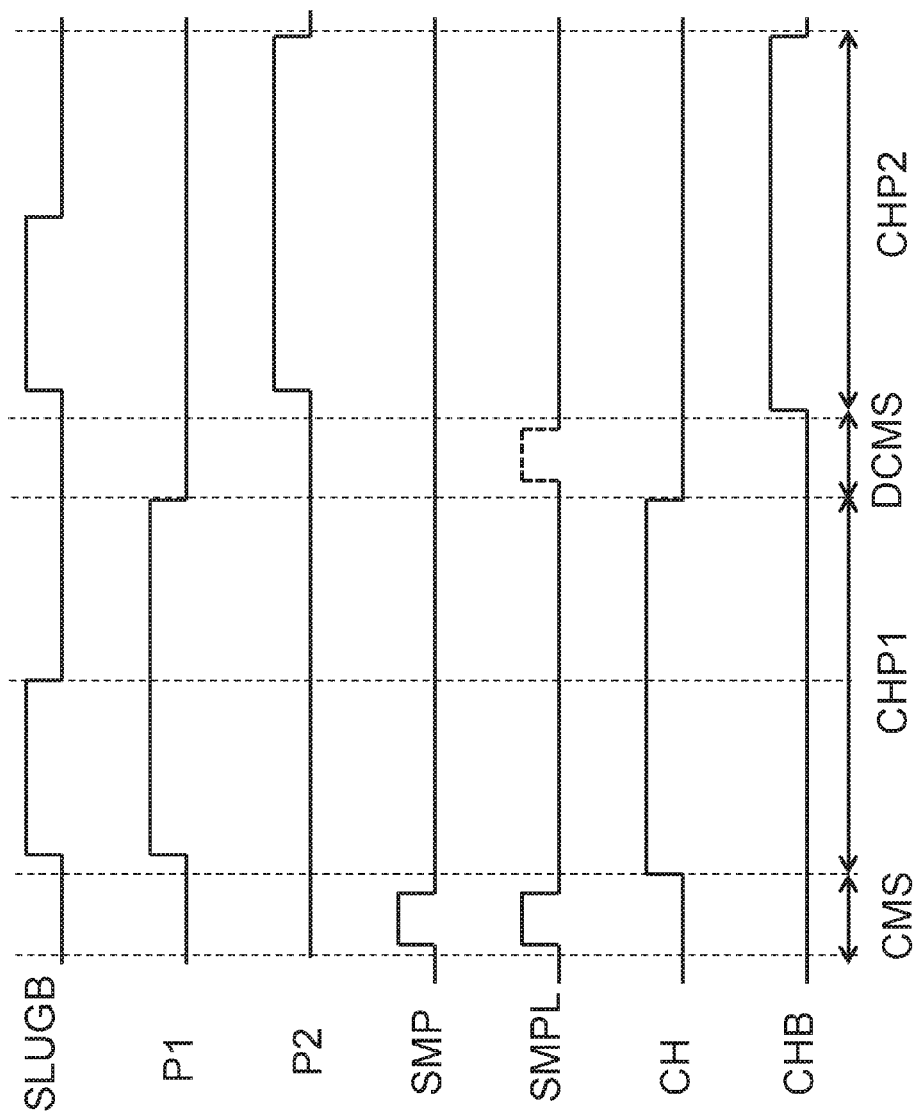
FIG. 10 illustrates a timing diagram for the input stage shown in FIG. 9, according to some embodiments of the present disclosure.

FIG. 9 shows a variant of the input stage of FIG. 5 where two backend ADCs are used, shown as ADC1 960-1 and ADC2 960-2. Each of the ADCs is configured to operate as described above for ADCs 160 and 560, except that they each now have their own switches P1 and P2, respectively (P2 for ADC2 being analogous to P1 for ADC1). This may allow a more efficient usage of the time, since while ADC1 samples the output of the CGA, ADC2 can convert the previously sampled value and vice versa. The scheme could be extended to more than two backend ADCs and it is readily applicable to the summing junction circuit of FIG. 4 as well. FIG. 10 illustrates a timing diagram for the input stage of FIG. 9. In view of the descriptions provided above, this timing diagram is self-explanatory, as well as the operation of the input stage 900, and, therefore, in the interests of brevity, descriptions are not repeated.

Figure 11:
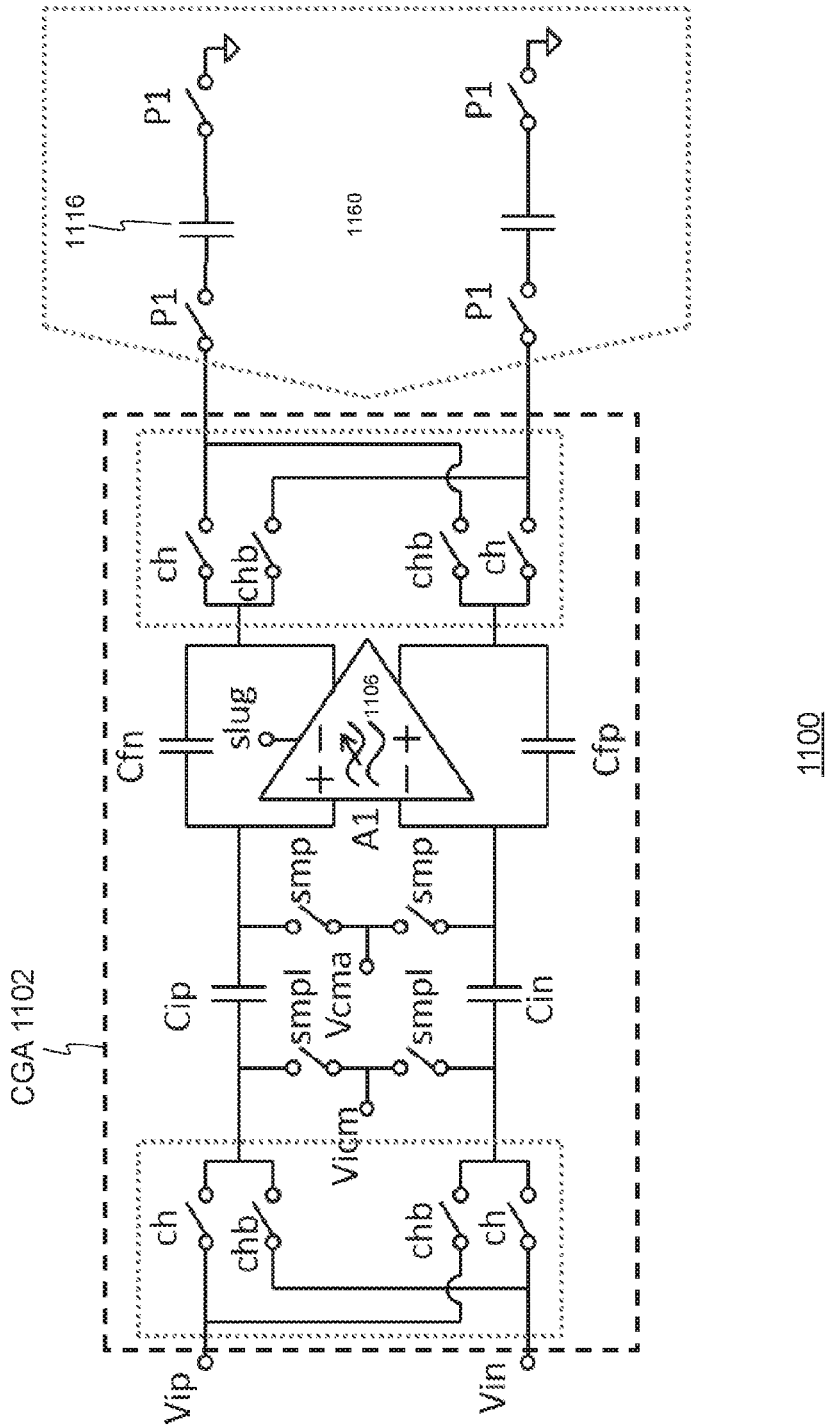
FIG. 11 illustrates an alternative dynamic filter for low noise precision input stage, according to some embodiments of the present disclosure.

As previously described, there may be different many ways to implement a dynamic filter having a first and second acquisition bandwidths as described herein, all of which are within the scope of the present disclosure. FIG. 11 illustrates a further embodiment of an input stage 1100 in which the amplifier A1 1106 of the CGA 1102 is configured to have a first and second bandwidth as shown in FIG. 3. The rest of the elements of the CGA 1102 are analogous to those shown for the CGA 502 and, therefore, their description is not repeated.

Figure 12:
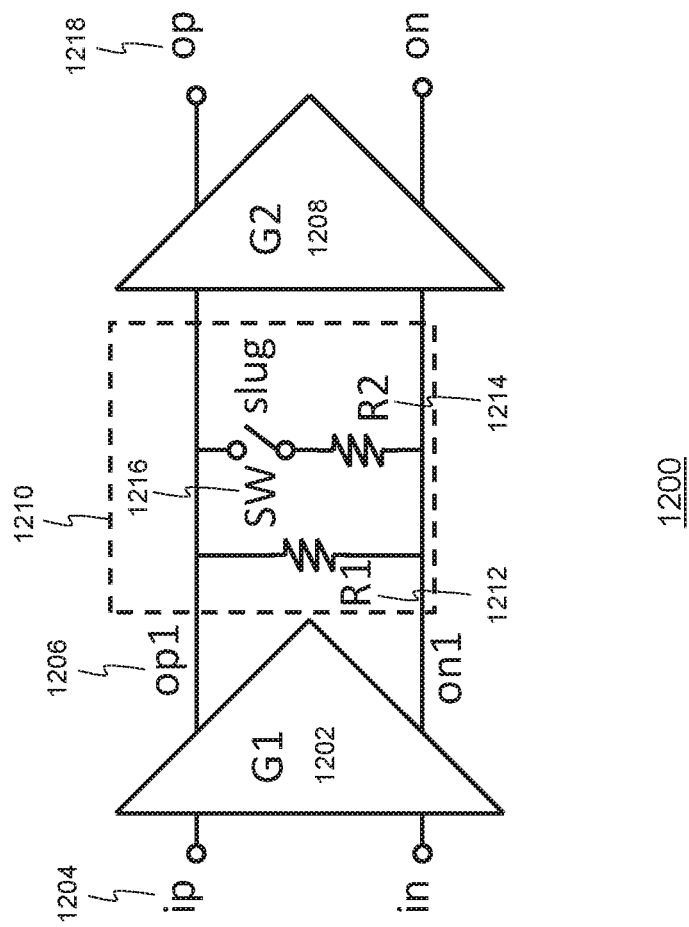
FIG. 12 illustrates a variable bandwidth amplifier to be used as an amplifier A1 shown in FIG. 11, according to some embodiments of the present disclosure.

In an embodiment, the amplifier A1 1106 can be implemented as shown in FIG. 12 with a scheme 1200. The timing diagram of FIG. 6 is applicable to this implementation bearing in mind that control signal SLUG is simply the logical inversion of control signal SLUGB described with reference to FIG. 6. As shown in FIG. 12, the amplifier A1 1200 may include a first stage G1 1202 which is a trans-conductance amplifier such that a voltage at its inputs 1204 is converted to a current at its output 1206. The amplifier G1 is followed by a further amplifier stage G2 1208. The voltage difference occurring between the inputs of the amplifier stage G2 1208 can be varied by controlling the value of a resistive network 1210 comprising resistors R1 1212 and R2 1214 that extends between the outputs of the differential amplifier G1 and the inputs of the differential amplifier G1. As shown in FIG. 12, resistor R1 may extend between the outputs of the amplifier G1 and a second resistor R2 in series with a switch SW 1216, such that current flow through the resistor R2 can be inhibited or allowed, as appropriate, depending on the switch SW state. Thus the gain of the amplifier 1200 can be adjusted between two levels depending on whether the switch SW 1216 is conducting or not. Switching the gain of the amplifier which is formed by the action of the amplifiers G1 and G2 does not actually make any significant difference to the output 1218 of amplifier G2 because the gain of the CGA is defined by the external CGA feedback network, components Cip, Cin, Cfn and Cfp (see FIG. 11) rather than by the intrinsic gains of the amplifier A1. However changing the "internal" gain seen by the amplifiers G1 and G2 does vary the bandwidth, which translates to variation of the bandwidth on the sampling capacitors 1116 of the ADC 1160. In further implementations where, for example, cascode transistors are provided within amplifiers, a resistive network, or indeed a switch, could be connected between suitable nodes to controllably reduce the bandwidth of the amplifier. Other bandwidth control techniques may include modifying bias currents within the amplifiers included within CGAs.

Figure 13:
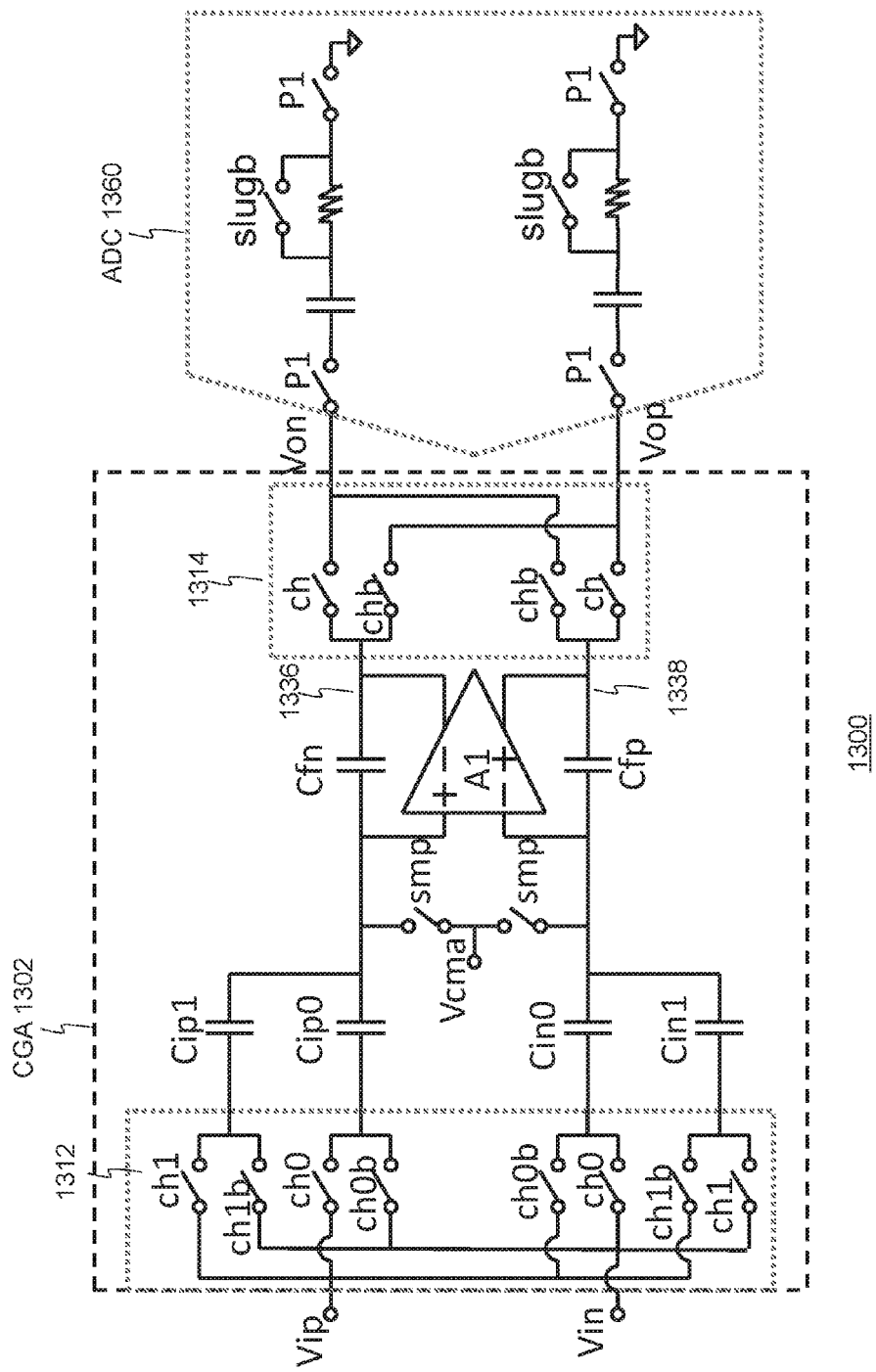
FIG. 13 illustrates an input stage with an alternative common mode sampling scheme according to some embodiments of the present disclosure.

FIG. 13 illustrates an input stage 1300 with an alternative common mode sampling scheme according to some embodiments of the present disclosure. The input stage 1300 includes an ADC 1360 which is analogous to the ADC 160 or 560 described above. The input stage 1300 also includes a CGA 1302 which is analogous to the CGA shown in FIG. 5, with differences as described below. Again, in the interests of brevity, descriptions of elements shown in FIG. 13 that are analogous to elements described above with reference to other FIGUREs are not repeated.

Implementation of FIG. 13 illustrates a way to generate the input common mode voltage (Vip+Vin)/2 reusing the input capacitors Cip and Cin rather than having to generate it explicitly with some resistor divider, buffer it, and then use it to charge Cip and Cin during the CMS phase. In an embodiment, each input capacitor may be provided as a pair of equally weighted sub-capacitors—e.g., as shown in FIG. 13, input capacitor Cip may be provided as a pair of equally weighted sub_capacitors Cip1 and Cip0, while input capacitor Cin may be provided as a pair of equally weighted sub_capacitors Cin0 and Cin1. Furthermore, the first chop circuit may include four pairs of switches as shown in FIG. 13, one pair provided for each of the sub-capacitors, one of the switches in each pair coupling the respective sub-capacitor to a first CGA input and the other of the switches in each pair coupling the respective sub-capacitor to a second CGA input.

Arrangement 1300 of FIG. 13 also differs from the arrangement 500 of FIG. 5 in that the Vicm and associated switches smpl are absent.

In an embodiment, the CGA may further include a shorting switch coupled between input terminals of the two input capacitors (not shown in FIG. 13 or other FIGUREs). Such a switch could be used to short out the differential voltage across the input capacitors during the CMS phase or DCMS phase.

In an embodiment, the CGA may further include a shorting switch coupled between output terminals of the differential amplifier (also not shown in FIG. 13 or other FIGUREs). Such a switch could be used to rapidly short out the differential voltage across the feedback capacitors Cfp/Cfn during the CMS and DCMS phases.

Figure 14:
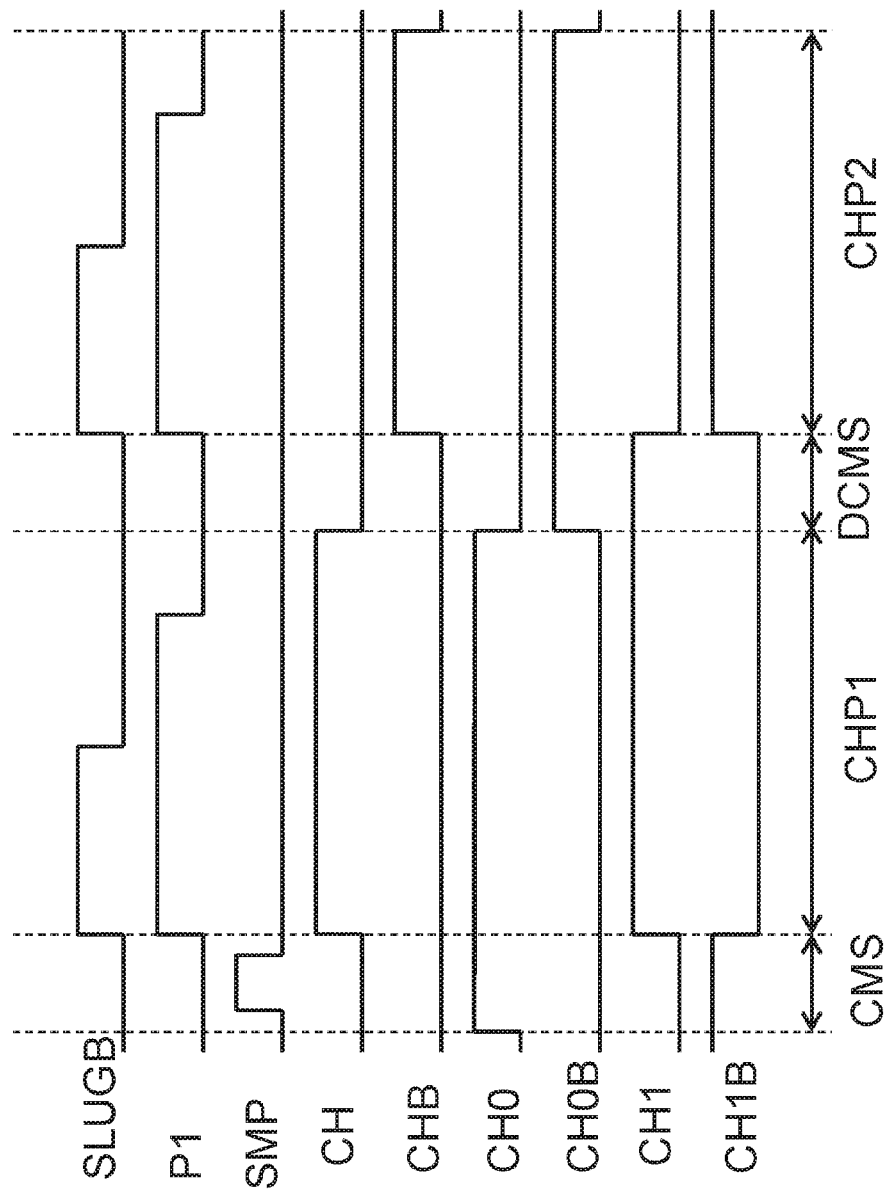
FIG. 14 illustrates a timing diagram for the input stage shown in FIG. 13, according to some embodiments of the present disclosure.

FIG. 14 illustrates a timing diagram for the input stage shown in FIG. 13, according to some embodiments of the present disclosure. As illustrated, operation of the CGA 1302 may occur over several phases of operation, CMS, CHP1, CHP2 and the optional DCMS phase. During the CMS phase, the CGA 1302 signals SMP, CH0 and CH1B may cause their respective switches smp, ch0 and ch1b, shown in FIG. 13, to be closed. The smp switches cause the output terminals of the Cip and Cin capacitors, including sub-capacitors Cip0, Cip1, Cin0, Cin1, to be connected to the amplifier common mode voltage Vcma. The ch0 switches of the first chop circuit 1312 may cause input terminals of the Cip0 and Cin0 sub-capacitors to be connected to Vip and Vin, respectively. The ch1b switches of the first chop circuit 1312 may cause the Cip1 and Cin1 capacitors to be connected to Vin and Vip, respectively.

Thus, the Cip0 and Cin1 sub-capacitors may capture a voltage Vip−Vcma during the CMS phase, and the Cip1 and Cin0 sub-capacitors may capture a voltage Vin−Vcma during the CMS phase. The CH and CHB control signals as shown in FIG. 14 cause the switches ch and chb, respectively, in the second chop circuit 1314 to remain open during the CMS phase.

Thus, the CGA 1302 may perform a sampling operation during the CMS phase that may define a common mode for input signals presented to the amplifier A1 during the operational phases CHP1, CHP2 that matches the amplifier's common mode.

During the first chop phase (CHP1), the CH0 and CH1 signals may cause their associated respective switches ch0 and ch1 to be closed, while the CH0B and CH1B signals may cause their respective switches ch0b and ch1b to be open. These control signals cause input terminals of the Cip capacitor, including both sub-capacitors Cip0 and Cip1, to be connected to the Vip input terminal and input terminals of the Cin capacitor, including both sub-capacitors Cin0 and Cin1, to be connected to the Vin terminal. From a common mode perspective, charge redistribution between the Cip sub-capacitors Cip0, Cip1 may cause a voltage to be developed across the Cip capacitor ½(Vip−Vin)−Vcma, which corresponds to Vicm−Vcma, where Vicm=½(Vip−Vin) is, by definition, the input common mode voltage for input voltage Vip, Vin. Similarly, charge redistribution between the Cin sub-capacitors Cin0, Cin1 may cause a voltage to be developed across the Cin capacitor as Vicm−Vcma. Thus, during the CHP1 phase, the amplifier A1 may be presented with an input signal that represents a difference between the Vip and Vin signals but shifted to the amplifier's common mode voltage Vcma.

During the CHP1 phase, the CH signal may cause its associated switches ch of the second chop circuit 1314 to be closed, thereby connecting the amplifier output terminal 1336 to the Von terminal and the amplifier output terminal 1338 to the Vop terminal. The CGA 1302, therefore, may generate a differential output voltage defined by the capacitances between the Cip/Cin capacitors and the Cfn/Cfp capacitors.

During the second chop phase (CHP2), the CH1B and CH0B signals may cause their associated respective switches ch1b and ch0b to be closed. The CH0 and CH1 signals may cause their associated respective switches ch0 and ch1 to be open. These control signals may cause input terminals of the Cip capacitor, including both sub-capacitors Cip0 and Cip1, to be connected to the Vin input terminal and input terminals of the Cin capacitor, including both sub-capacitors Cin0 and Cin1, to be connected to the Vip terminal. From a common mode perspective, as with phase CHP1, charge redistribution between the Cip sub-capacitors Cip0, Cip1 may cause a voltage to be developed across the Cip capacitor ½(Vip−Vin)−Vcma, which corresponds to Vicm−Vcma. Similarly, charge redistribution between the Cin sub-capacitors Cin0, Cin1 may cause a voltage to be developed across the Cin capacitor as Vicm−Vcma. Thus, during the CHP2 phase, the amplifier A1 may be presented with an input signal that represents a difference between the Vip and Vin signals but shifted to the amplifier's common mode voltage Vcma.

During the CHP2 phase, the CHB signal may cause its associated switches chb of the second chop circuit 1314 to be closed, thereby connecting the amplifier output terminal 1336 to the Vop terminal and the amplifier output terminal 1338 to the Von terminal. The CGA 1302 may generate a differential output voltage defined by the capacitances between the Cip/Cin capacitors and the Cfn/Cfp capacitors.

In an embodiment, control signals CH and CHB to the second chop circuit 1304 may have a shorter duration than the control signals CH1/CH0 and CH1B/CH0B that are input to the first chop circuit 1303. This may cause the output terminals VON, VOP to disconnect from output terminals of the amplifier A1 as the chop circuit transitions between the CHP1 and CHP2 phases and thereby reduces any glitches that otherwise might occur if the amplifier outputs were connected to the output terminals VON, VOP for the full duration of the CH0/CH1, CH0B/CH1B signals.

In some cases, the CHP2 phase may follow the CHP1 phase immediately. Optionally, a DCMS may be introduced between successive chop phases. The DCMS phase may provide symmetry in the amplifier's output signals during operation. During the DCMS phase, the CH0B and CH1 signals may cause their associated switches to be closed while the CH0 and CH1B signals may cause their switches to be open. The CH0B switches may cause input terminals of the Cip0 and Cin0 sub-capacitors to be connected to Vin and Vip respectively. The CH1B switches may cause input terminals of the Cip1 and Cin1 capacitors to be connected to Vip and Vin, respectively. During the DCMS phase, however, the smp switches and the switches of the second chop circuit 1314 are open. In this case, no sampling action occurs in the DCMS phase and, therefore, no additional kT/C noise is introduced to the CGA.

Also, as in the embodiments described above, a single CMS phase may be followed by multiple CHP1, CHP2 and, optionally, DCMS phases.

In various embodiments, the capacitors Cip, Cin, Cfn and Cfp may be variable capacitors and a ratio of capacitances between the Cip/Cin capacitors and the Cfn/Cfp capacitors may determine the gain that will be provided by the CGA 1302. Each capacitor Cip, Cin, Cfn and Cfp may be provided as an array of capacitor devices with interconnecting switches (not shown) that selectively include capacitors from the array into or out of the CGA 1302. During the CMS phase, the Cip0, Cip1, Cin0 and Cin1 capacitances may be set to be equal to each other. Thus, when capacitors from the Cip and Cin capacitor arrays are selected to set the CGA's amplification, half of the selected capacitors may be provided to form the Cip1 and Cin1 sub-capacitors and the other half of the selected capacitors may form the Cip0 and Cin0 sub-capacitors.

The operation of the input stage of FIG. 13 differs from the operation of input stage of FIG. 5 mainly in the way the common mode at the input of amplifier A1 is defined. The operation of the "dynamic" filtering and the operation of the ADC 1360 is analogous and, therefore, in the interests of brevity, is not repeated.

Examples

Example 1 provides an input stage for an ADC, the input stage including at least one sampling capacitor configured to sample an input signal in acquire phases; a capacitive gain amplifier (CGA) configured to provide said input signal to said at least one sampling capacitor of the ADC; and bandwidth control means configured to: ensure that the at least one sampling capacitor has a first bandwidth during a first part of an acquire phase, and ensure that the at least one sampling capacitor has a second bandwidth during a second part of said acquire phase, said second part following said first part of said acquire phase, where said second bandwidth is smaller than said first bandwidth.

Example 2 provides the input stage according to Example 1, where the bandwidth control means includes at least one resistor implemented in series with the at least one sampling capacitor of the ADC, where, during the first part of the acquire phase, the at least one resistor is shorted out, while, during the second part of the acquire phase, the at least one resistor in series with the at least one sampling capacitor acts as a lowpass RC filter.

Example 3 provides the input stage according to Example 2, where, during the second part of the acquire phase, the at least one resistor is not shorted out.

Example 4 provides the input stage according to Example 1, where the bandwidth control means includes means for changing a bandwidth of the input signal provided from the CGA to the at least one sampling capacitor.

Example 5 provides the input stage according to any one of the preceding Examples, where the CGA includes a differential amplifier having a pair of inputs and a pair of outputs, a pair of input capacitors having output terminals connected respectively to inputs of the differential amplifier, a pair of feedback capacitors connected respectively between outputs of the differential amplifier and corresponding inputs of the differential amplifier, a first cross-coupled chop circuit connecting the input capacitors to respective input terminals of the CGA, and a second cross-coupled chop circuit connecting the output terminals of the differential amplifier to respective output terminals of the CGA.

Example 6 provides the input stage according to Example 5, where the CGA further includes a voltage source coupled to input terminals of the differential amplifier via respective switches, having a voltage set to a common mode voltage of the differential amplifier.

Example 7 provides the input stage according to Example 6, where the CGA further includes a second voltage source coupled to input terminals of the input capacitors via respective switches, having a voltage set to a common mode of signals to be input to the CGA.

Example 8 provides the input stage according to Example 6, where each input capacitor is provided as a pair of equally weighted sub-capacitors, and the first chop circuit includes four pairs of switches, one pair provided for each of the sub-capacitors, one of the switches in each pair coupling the respective sub-capacitor to a first CGA input and the other of the switches in each pair coupling the respective sub-capacitor to a second CGA input.

Example 9 provides the input stage according to Example 6, where the CGA further includes a shorting switch coupled between input terminals of the two input capacitors.

Example 10 provides the input stage according to Example 6, where the CGA further includes a shorting switch coupled between output terminals of the differential amplifier.

Example 11 provides the input stage according to Example 6, where the CGA further includes a controller to manage switch configurations of the CGA, the controller cycling the CGA through several phases of operation: a common mode sampling phase during which the input capacitors sample voltages representing a difference between a common mode voltage of input signals to the CGA and the common mode voltage of the differential amplifier, a first chop phase during which the first and second chop circuits configure propagation of input signals about the differential amplifier in a first orientation, and a second chop phase during which the first and second chop circuits configure propagation of input signals about the differential amplifier in a second orientation, inverse of the first orientation.

Example 12 provides the input stage according to Example 11, where the controller is configured to manage switch configurations for another phase of operation in which the input capacitors are presented with the common mode voltage of the input signals but not the common mode voltage of the differential amplifier.

Example 13 provides the input stage according to Example 6, where the differential amplifier is an autozeroing amplifier.

Example 14 provides the input stage according to Example 6, where the differential amplifier is a trimmed amplifier.

Example 15 provides the input stage according to Example 6, where the CGA further includes a pair of digital to analog converter (DAC) capacitors respectively connectable to the pair of inputs of the differential amplifier, thus implementing an input summing junction, as shown e.g. in FIG. 4, 7, or 8, that generates the difference between the input signal Vip-Vin and another signal, Vdachn-Vdachp, generated from a DAC.

Example 16 provides the input stage according to any one of the preceding Examples, where the at least one sampling capacitor is a switched capacitor of a first array of capacitors used in a successive approximation analog to digital conversion.

Example 17 provides the input stage according to any one of the preceding Examples, where the first part of the acquire phase is long enough to allow the at least one sampling capacitor to be charged to an output voltage of the CGA.

Example 18 provides the input stage according to any one of the preceding Examples, where the second part of the acquire phase is long enough to allow CGA noise to be attenuated by a low pass filter of the at least one sampling capacitor and the at least one resistor implemented in series with the at least one sampling capacitor.

Example 19 provides the input stage according to any one of the preceding Examples, where the bandwidth control means is configured to operate prior to, or as a part of sampling the input signal.

Example 20 provides a method of operating an input stage for an ADC, where the ADC includes at least one sampling capacitor used to sample an input signal in acquire phases and where the ADC is configured to be driven by a capacitive programmable gain amplifier (CGA). The method includes ensuring that the at least one sampling capacitor has a first bandwidth during a first part of an acquire phase, and ensuring that the at least one sampling capacitor has a second bandwidth during a second part of said acquire phase, said second part following said first part of said acquire phase, where said second bandwidth is smaller than said first bandwidth.

Example 21 provides the method according to Example 20, the method including steps of operating the input stage according to any one of Examples 1-19.

Example 22 provides a computer program configured to implement the method according to any one of the preceding Examples.

Example 23 provides a system comprising means for implementing the method according to any one of the preceding Examples.

Example 24 provides a system including at least one memory element configured to store computer executable instructions, and at least one processor coupled to the at least one memory element and configured, when executing the instructions, to carry out the method according to any one of the preceding Examples.

Example 25 provides one or more non-transitory tangible media encoding logic that include instructions for execution that, when executed by a processor, are operable to perform operations of the method according to any one of the preceding Examples.

Variations and Implementations

In the discussions of the embodiments above, the capacitors, comparators, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the overload protection functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with converting an analog signal to a digital signal and processing such digital signal. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems utilizing a delta-sigma ADC. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision or high-speed data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for products related to image processing.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to overload protection, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

Parts of various apparatuses for providing improved input stage as described herein can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

Note that all optional features of the apparatus described above may also be implemented with respect to the method or process described herein and specifics in the examples may be used anywhere in one or more embodiments.

Although the claims are presented in single dependency format in the style used before the USPTO, it should be understood that any claim can depend on and be combined with any preceding claim of the same type unless that is clearly technically infeasible.

What is claimed is:

1. An analog to digital converter (ADC) system comprising:
   at least one sampling capacitor configured to sample an input signal in acquire phases;
   a capacitive gain amplifier (CGA) configured to provide said input signal to said at least one sampling capacitor of an ADC; and
   bandwidth control means configured to:
   ensure that the at least one sampling capacitor has a first bandwidth during a first part of an acquire phase, and
   ensure that the at least one sampling capacitor has a second bandwidth during a second part of said acquire phase, said second part following said first part of said acquire phase, wherein said second bandwidth is smaller than said first bandwidth.

2. The ADC system according to claim 1, wherein the bandwidth control means comprises at least one resistor implemented in series with the at least one sampling capacitor of the ADC, wherein, during the first part of the acquire phase, the at least one resistor is shorted out, while, during the second part of the acquire phase, the at least one resistor in series with the at least one sampling capacitor acts as a low-pass RC filter.

3. The ADC system according to claim 2, wherein, during the second part of the acquire phase, the at least one resistor is not shorted out.

4. The ADC system according to claim 1, wherein the bandwidth control means comprises means for changing a bandwidth of the input signal provided from the CGA to the at least one sampling capacitor.

5. The ADC system according to claim 1, wherein the CGA comprises:
   a differential amplifier having a pair of inputs and a pair of outputs,
   a pair of input capacitors having output terminal respectively connectable to the pair of inputs of the differential amplifier,
   a pair of feedback capacitors respectively connectable between the pair of outputs of the differential amplifier and corresponding pair of inputs of the differential amplifier,
   a first chop circuit configured to connect the input capacitors to respective input terminals of the CGA, and
   a second chop circuit configured to connect the output terminals of the differential amplifier to respective output terminals of the CGA.

6. The ADC system according to claim 5, wherein the CGA further comprises:
   a voltage source configured to be coupled to the pair of input terminals of the differential amplifier via respective switches, having a voltage set to a common mode voltage of the differential amplifier.

7. The ADC system according to claim 6, wherein the CGA further comprises a second voltage source configured to be coupled to input terminals of the input capacitors via respective switches, having a voltage set to a common mode of signals to be input to the CGA.

8. The ADC system according to claim 7, wherein each input capacitor is provided as a pair of equally weighted sub-capacitors, and the first chop circuit comprises four pairs of switches, one pair provided for each of the sub-capacitors, one of the switches in each pair configured to couple a respective sub-capacitor to a first CGA input and the other of the switches in each pair configured to couple the respective sub-capacitor to a second CGA input.

9. The ADC system according to claim 6, wherein the CGA further comprises a shorting switch coupled between input terminals of the two input capacitors.

10. The ADC system according to claim 6, wherein the CGA further comprises a shorting switch coupled between output terminals of the differential amplifier.

11. The ADC system according to claim 6, wherein the CGA further comprises a controller to manage switch configurations of the CGA, the controller cycling the CGA through several phases of operation:
   a common mode sampling phase during which the input capacitors sample voltages representing a difference between a common mode voltage of input signals to the CGA and the common mode voltage of the differential amplifier,
   a first chop phase during which the first and second chop circuits configure propagation of input signals about the differential amplifier in a first orientation, and
   a second chop phase during which the first and second chop circuits configure propagation of input signals about the differential amplifier in a second orientation, inverse of the first orientation.

12. The ADC system according to claim 11, wherein the controller is configured to manage switch configurations for another phase of operation in which the input capacitors are presented with the common mode voltage of the input signals but not the common mode voltage of the differential amplifier.

13. The ADC system according to claim 6, wherein the differential amplifier is an autozeroing amplifier.

14. The ADC system according to claim 6, wherein the differential amplifier is a trimmed amplifier.

15. The ADC system according to claim 5, wherein the CGA further comprises:
   a pair of digital to analog converter (DAC) capacitors respectively connectable to the pair of inputs of the differential amplifier.

16. The ADC system according to claim 1, wherein the at least one sampling capacitor is a switched capacitor of a first array of capacitors used in a successive approximation analog to digital conversion.

17. The ADC system according to claim 1, wherein the first part of the acquire phase is long enough to allow the at least one sampling capacitor to be charged to an output voltage of the CGA.

18. The ADC system according to claim DR, wherein the second part of the acquire phase is long enough to allow CGA noise to be attenuated by a low pass filter of the at least one sampling capacitor and the at least one resistor implemented in series with the at least one sampling capacitor.

19. The ADC system according to claim 1, wherein the bandwidth control means is configured to operate prior to, or as a part of sampling the input signal.

20. A method of operating an analog to digital converter (ADC) system comprising at least one sampling capacitor and a capacitive gain amplifier (CGA), the method comprising:
   providing an input signal from the CGA to the at least one sampling capacitor of an ADC, the at least one sampling capacitor used to sample the input signal in acquire phases;
   ensuring that the at least one sampling capacitor has a first bandwidth during a first part of an acquire phase; and
   ensuring that the at least one sampling capacitor has a second bandwidth during a second part of said acquire phase, said second part following said first part of said acquire phase, wherein said second bandwidth is smaller than said first bandwidth.

21. The method according to claim 20, wherein the ADC system further comprises at least one resistor implemented in series with the at least one sampling capacitor of the ADC, and wherein
   ensuring that the at least one sampling capacitor has the first bandwidth during the first part of said acquire phase comprises shorting the at least one resistor out, and
   ensuring that the at least one sampling capacitor has the second bandwidth during the second part of said acquire phase comprises configuring the at least one resistor in series with the at least one sampling capacitor to act as a lowpass RC filter.

22. The method according to claim 21, wherein the second part of the acquire phase is long enough to allow CGA noise to be attenuated by a low pass filter of the at least one sampling capacitor and the at least one resistor implemented in series with the at least one sampling capacitor.

23. The method according to claim 20, wherein the first part of the acquire phase is long enough to allow the at least one sampling capacitor to be charged to an output voltage of the CGA.

24. The method according to claim 20, wherein
   ensuring that the at least one sampling capacitor has the first bandwidth during the first part of said acquire phase and that the at least one sampling capacitor has the second bandwidth during the second part of said acquire phase comprises ensuring that the bandwidth of the input signal provided from the CGA to the at least one sampling capacitor is smaller during the second part of said acquire phase compared to the first part of said acquire phase.

25. The method according to claim 20, wherein the at least one sampling capacitor is a switched capacitor of a first array of capacitors, and the method further comprises using the first array of capacitors in a successive approximation analog to digital conversion.

26. An analog to digital converter (ADC) system comprising:
- at least one sampling capacitor configured to sample an input signal in acquire phases;
- a capacitive gain amplifier (CGA) configured to provide said input signal to said at least one sampling capacitor of an ADC; and
- at least one resistor implemented in series with the at least one sampling capacitor of the ADC and configured to:
  - ensure that the at least one sampling capacitor has a first bandwidth during a first part of an acquire phase, and
  - ensure that the at least one sampling capacitor has a second bandwidth during a second part of said acquire phase, said second part following said first part of said acquire phase, wherein said second bandwidth is smaller than said first bandwidth.

27. The ADC system according to claim 26, wherein, during the first part of the acquire phase, the at least one resistor is shorted out, while, during the second part of the acquire phase, the at least one resistor in series with the at least one sampling capacitor acts as a lowpass RC filter.

* * * * *